(12) United States Patent
Chow et al.

(10) Patent No.: US 9,030,865 B2
(45) Date of Patent: May 12, 2015

(54) CIRCUIT ARRANGEMENT AND METHOD OF FORMING THE SAME

(71) Applicant: Agency for Science, Technology and Research, Singapore (SG)

(72) Inventors: Kit Ho Melvin Chow, Singapore (SG); Fei Li, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/057,222

(22) Filed: Oct. 18, 2013

(65) Prior Publication Data

US 2014/0112066 A1   Apr. 24, 2014

Related U.S. Application Data

(60) Provisional application No. 61/715,304, filed on Oct. 18, 2012.

(51) Int. Cl.
| | |
|---|---|
| *G11C 5/06* | (2006.01) |
| *G11C 5/02* | (2006.01) |
| *G11C 5/08* | (2006.01) |
| *G11C 8/00* | (2006.01) |
| *G11C 7/00* | (2006.01) |
| *G11C 11/16* | (2006.01) |
| *G11C 11/56* | (2006.01) |
| *G11C 13/00* | (2006.01) |

(52) U.S. Cl.
CPC ........ *G11C 11/1673* (2013.01); *G11C 11/1675* (2013.01); *G11C 11/5607* (2013.01); *G11C 5/02* (2013.01); *G11C 13/0069* (2013.01); *G11C 8/00* (2013.01); *G11C 5/06* (2013.01); *G11C 11/16* (2013.01)

(58) Field of Classification Search
CPC .............. G11C 11/1675; G11C 11/16; G11C 11/5607; G11C 5/06; G11C 5/02; G11C 13/0069; G11C 8/00
USPC ........................... 365/158, 63, 51, 66, 189.07
See application file for complete search history.

(56) References Cited

U.S. PATENT DOCUMENTS

| | | | |
|---|---|---|---|
| 2009/0034323 A1* | 2/2009 | Lung et al. | 365/163 |
| 2011/0188301 A1* | 8/2011 | Wang et al. | 365/158 |
| 2013/0162306 A1* | 6/2013 | Inoue et al. | 327/109 |

* cited by examiner

*Primary Examiner* — Ly D Pham
(74) *Attorney, Agent, or Firm* — K. David Crockett, Esq.; Niky Economy Syrengelas, Esq.; Crockett & Crockett, PC

(57) ABSTRACT

In various embodiments, a circuit arrangement may be provided including a data cell. The circuit arrangement may further include a first transistor and a second transistor. The first controlled electrode of the first transistor and the first controlled electrode of the second transistor may be coupled to the first electrode of the data cell. The second controlled electrode of the first transistor may be configured to electrically connect to a first reference voltage such that the first electrode of the data cell is electrically connected to the first reference voltage when the first transistor is activated. The second controlled electrode of the second transistor may be configured to electrically connect to a second reference voltage, such that the first electrode of the data cell is electrically connected to the second reference voltage when the second transistor is activated.

19 Claims, 20 Drawing Sheets

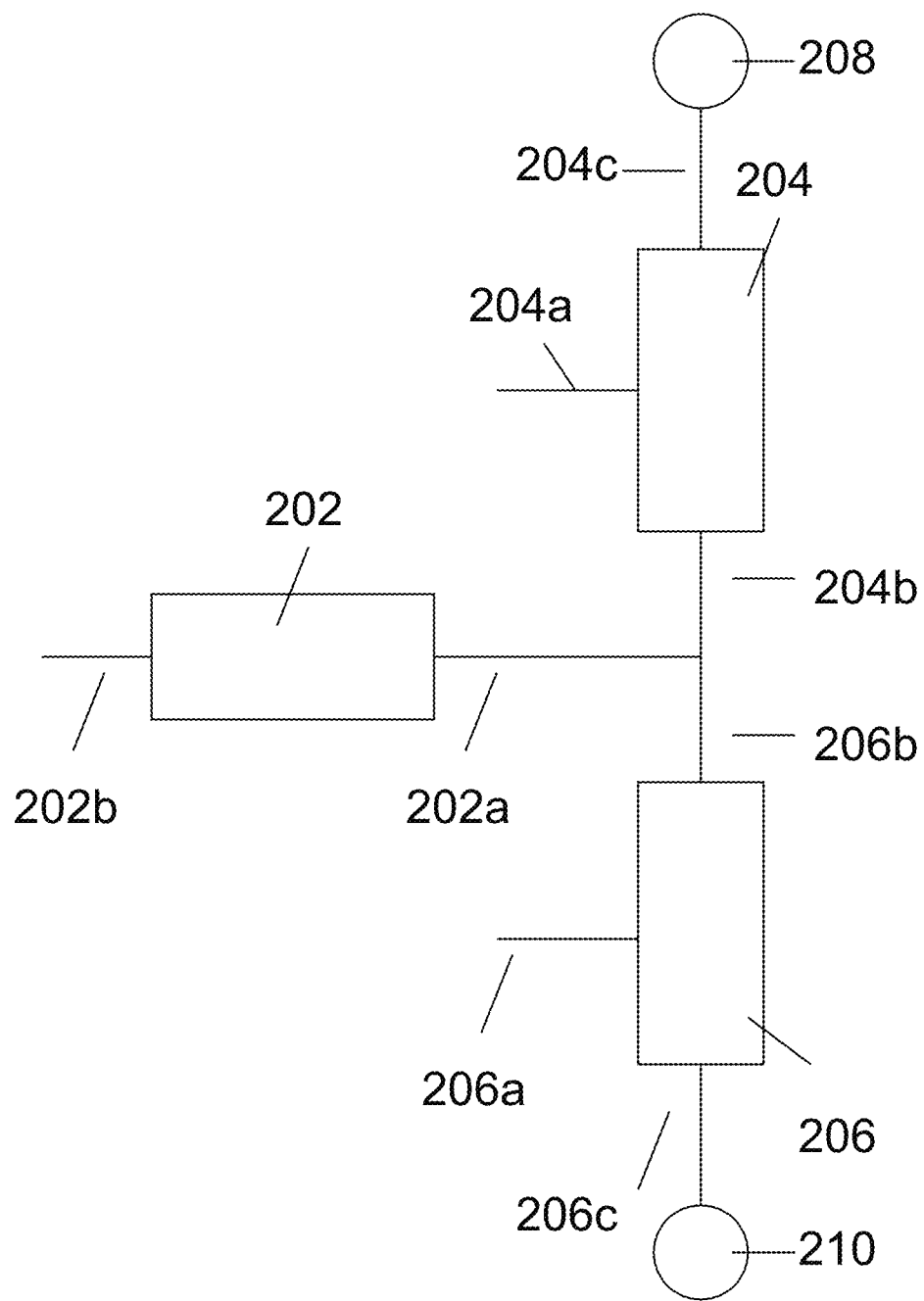

500b

506a

500c

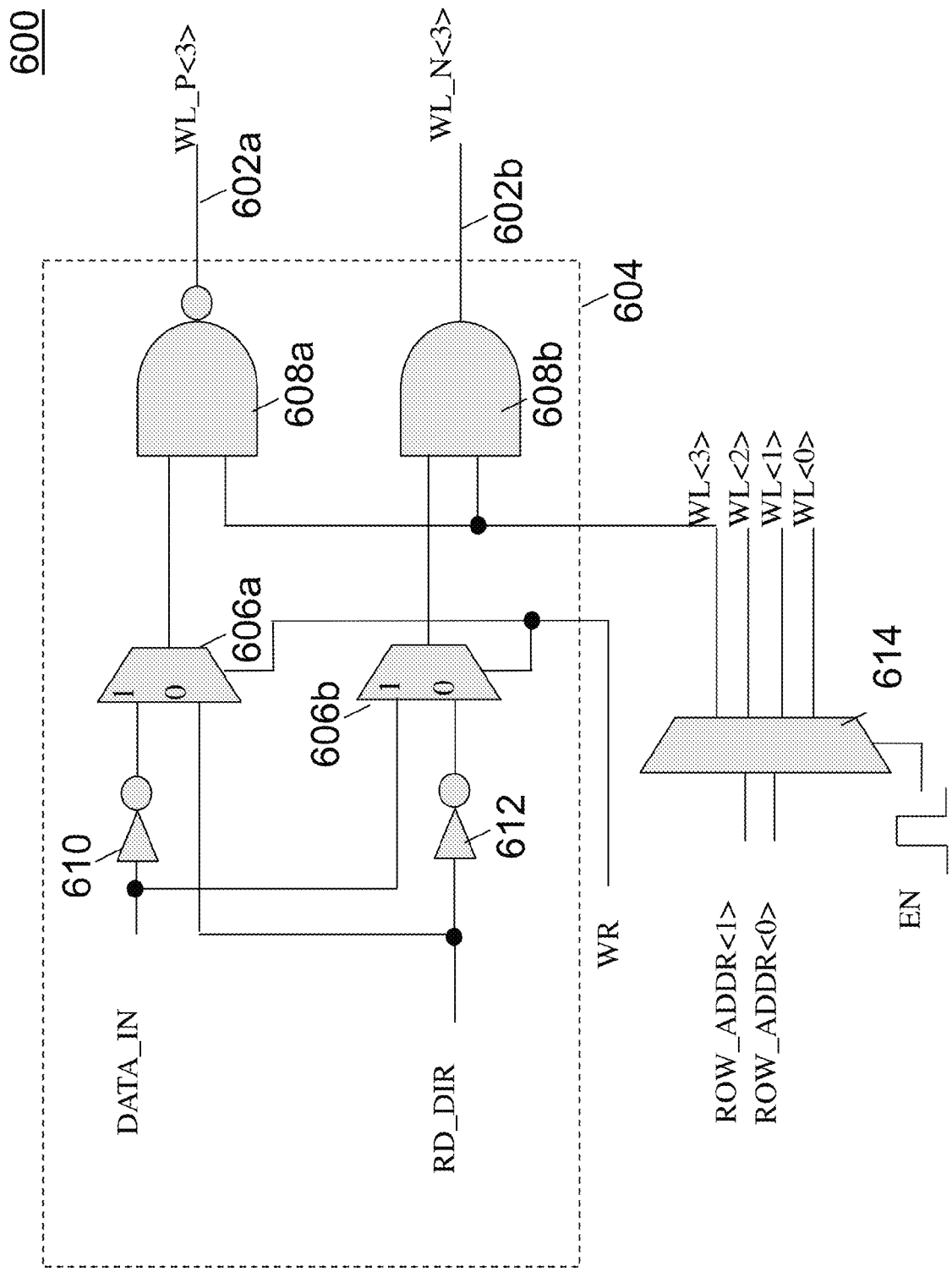

```
couple a first controlled electrode of a first
transistor and a first controlled electrode of a
second transistor to a first electrode of a data
cell
```
↘ 1002

```
electrically connect a first reference voltage to a
second controlled electrode of the first
transistor such that the first electrode of the
data cell is electrically connected to the first
reference voltage via the first transistor when
the first transistor is activated by a first word
line voltage applied to the control electrode of
the first transistor
```
↘ 1004

```
electrically connect a second reference voltage
to a second controlled electrode of the second
transistor such that the first electrode of the
data cell is electrically connected to the second
reference voltage via the second transistor
when the first transistor is activated by a
second word line voltage applied to the control
electrode of the second transistor
```
↘ 1006

CIRCUIT ARRANGEMENT AND METHOD OF FORMING THE SAME

CROSS-REFERENCE TO RELATED APPLICATIONS

This application claims the benefit of priority of U.S. provisional application No. 61/715,304 filed Oct. 18, 2012, the contents of which are incorporated herein by reference for all purposes.

TECHNICAL FIELD

Various aspects of this disclosure relate to circuit arrangements, especially circuit arrangements including data cells, as well as methods of forming the same.

BACKGROUND

Recently, a new write mechanism, which is based upon spin polarization current induced magnetization switching, has been introduced to the magnetic random access memory (MRAM) design. This new MRAM design, called Spin-Transfer Torque MRAM (STT-MRAM), uses a bidirectional writing current through the magnetic tunneling junction (MTJ) to realize the resistance switching. Depending on the direction of the writing current, the free ferromagnetic layer in the MTJ can be aligned parallel or anti-parallel to the pinned layer and consequently provide a different resistance state.

Each STT-MRAM memory cell usually includes one n-channel metal oxide semiconductor (NMOS) transistor to act as a switch (i.e. a select transistor) for selecting the cell during reading or writing. However, as STT-MRAM memory cells scales down with complementary metal oxide semiconductor (CMOS) technology, the driving ability (in opposing current flows) across the STT-MRAM becomes more asymmetric. The transition between the 2 states occurs beyond a threshold current or voltage applied to the MTJ. The required threshold current dictates the size of the word-line select transistor and limits the extent in which STT-MRAM memory cells can be scaled down. The current flow is further exacerbated in the direction from select transistor to the MTJ. FIG. 1A is a schematic 100a showing a current flowing though select transistor 102 and MTJ 104 in a first direction, i.e. from the MTJ 104 to the select transistor 102. FIG. 1B is a schematic 100b showing a current flowing though select transistor 102 and MTJ 104 in a first direction, i.e. from the select transistor 102 to the MTJ 104. As shown in FIGS. 1A and 1B, the current flow in the direction from the select transistor 102 to the MTJ 104 is constricted as the potential drop across MTJ 104 reduces the available gate drive across transistor 102. Consequently, the gate drive across transistor 102 is less than VDD. Negative feedback due to source degeneration worsens the situation. The problems are not limited to only write operations. These issues require the n-channel metal oxide semiconductor (NMOS) transistor 102 of the STT-MRAM memory cell to maintain a relatively large area which limits the ability to scale down the technology.

The usage of a transmission gate in place of the NMOS has been proposed by prior-arts to circumvent the issue. However, the transmission gate has limited functionality and serves solely as a word-line selection switch. The terminal of the transmission gate that is not connected to the MTJ is known commonly as the source line (SL). The terminal of the MTJ that is not connected to the transmission gate is known commonly as the bit line (BL). FIG. 1C is a schematic illustrating a memory array. A STT-MRAM memory cell 152 of the memory array includes a transmission gate 154 and a MTJ 156. The transmission gate 154 is coupled by source line (SL) 158 to source line (SL) driver 160. The MTJ 156 is coupled by bit line (BL) 162 to bit line (BL) driver 164. Both the source line 158 and bit line 162 has to be driven by drivers 160, 164 external to the memory cell 152 and array. It other words, having both the SL and BL lines 158, 162 inevitably necessitates a two port access (i.e. via both SL 158 and BL 162) to an individual memory cell 152. The task of decoding of both the SL line 156 and BL line 158 is the burden of the column decoder. Further, high RC capacitance may exist on the SL line 158 and BL line 162.

SUMMARY

In various embodiments, a circuit arrangement may be provided. The circuit arrangement may include a data cell having a first electrode and a second electrode. The circuit arrangement may further include a first transistor having a control electrode, a first controlled electrode and a second controlled electrode. The circuit arrangement may also include a second transistor having a control electrode, a first controlled electrode and a second controlled electrode. The first controlled electrode of the first transistor and the first controlled electrode of the second transistor may be coupled to the first electrode of the data cell. The second controlled electrode of the first transistor may be configured to electrically connect to a first reference voltage such that the first electrode of the data cell is electrically connected to the first reference voltage via the first transistor when the first transistor is activated by a first word line voltage applied to the control electrode of the first transistor. The second controlled electrode of the second transistor may be configured to electrically connect to a second reference voltage, such that the first electrode of the data cell is electrically connected to the second reference voltage via the second transistor when the second transistor is activated by a second word line voltage applied to the control electrode of the second transistor.

In various embodiments, a method of forming a circuit arrangement may be provided. The method may include coupling a first controlled electrode of a first transistor and a first controlled electrode of a second transistor to a first electrode of a data cell. The method may further include electrically connecting a first reference voltage to a second controlled electrode of the first transistor such that the first electrode of the data cell is electrically connected to the first reference voltage via the first transistor when the first transistor is activated by a first word line voltage applied to the control electrode of the first transistor. The method may also include electrically connecting a second reference voltage to a second controlled electrode of the second transistor such that the first electrode of the data cell is electrically connected to the second reference voltage via the second transistor when the first transistor is activated by a second word line voltage applied to the control electrode of the second transistor.

BRIEF DESCRIPTION OF THE DRAWINGS

The invention will be better understood with reference to the detailed description when considered in conjunction with the non-limiting examples and the accompanying drawings, in which:

FIG. 2 shows a schematic of a circuit arrangement according to various embodiments.

FIG. 6 is a schematic showing a row logic circuit according to various embodiments.

FIG. 10 is a schematic illustrating a method of forming a circuit arrangement according to various embodiments.

DETAILED DESCRIPTION

Figure 1A:
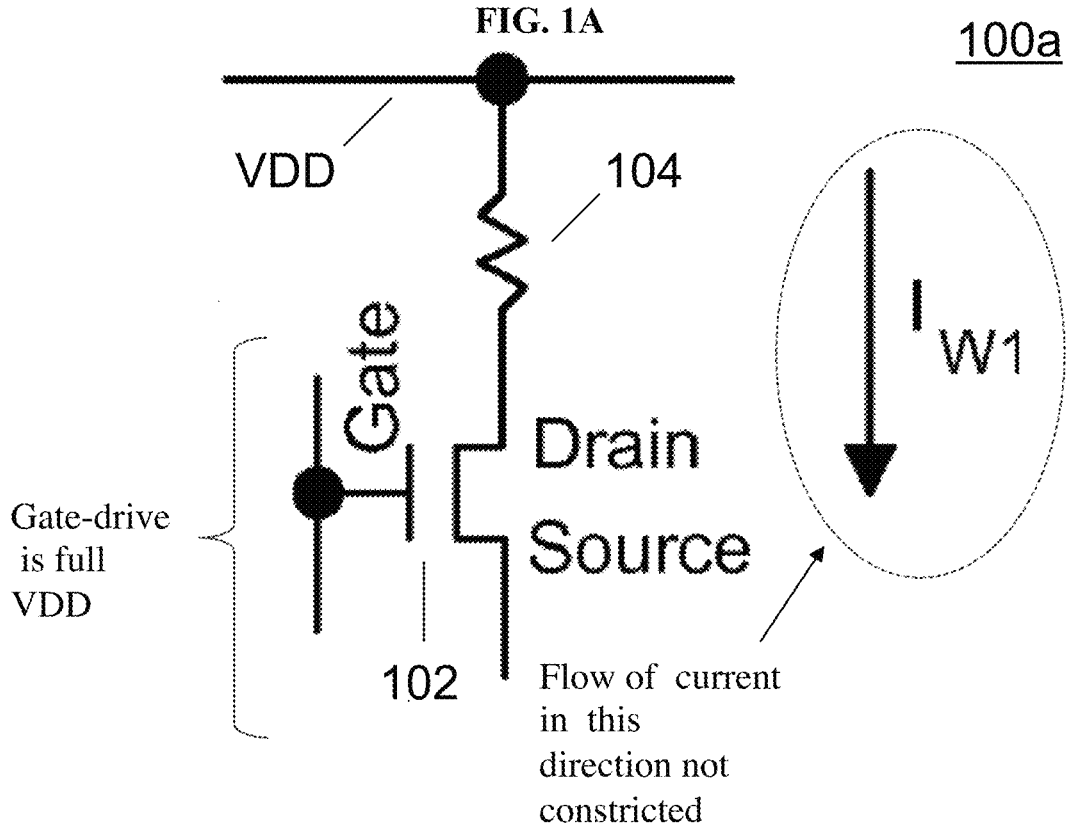
FIG. 1A is a schematic showing a current flowing though select transistor and magnetic tunneling junction (MTJ) in a first direction, i.e. from the MTJ to the select transistor.
Figure 1B:
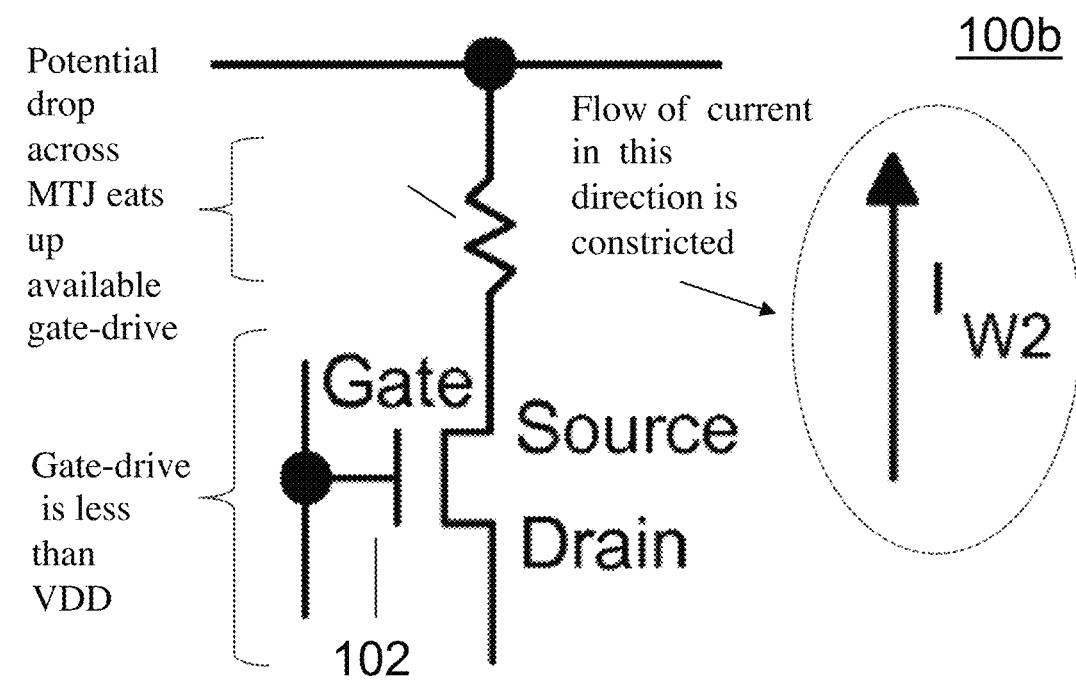
FIG. 1B is a schematic showing a current flowing though select transistor and MTJ in a first direction, i.e. from the select transistor to the MTJ.
Figure 1C:
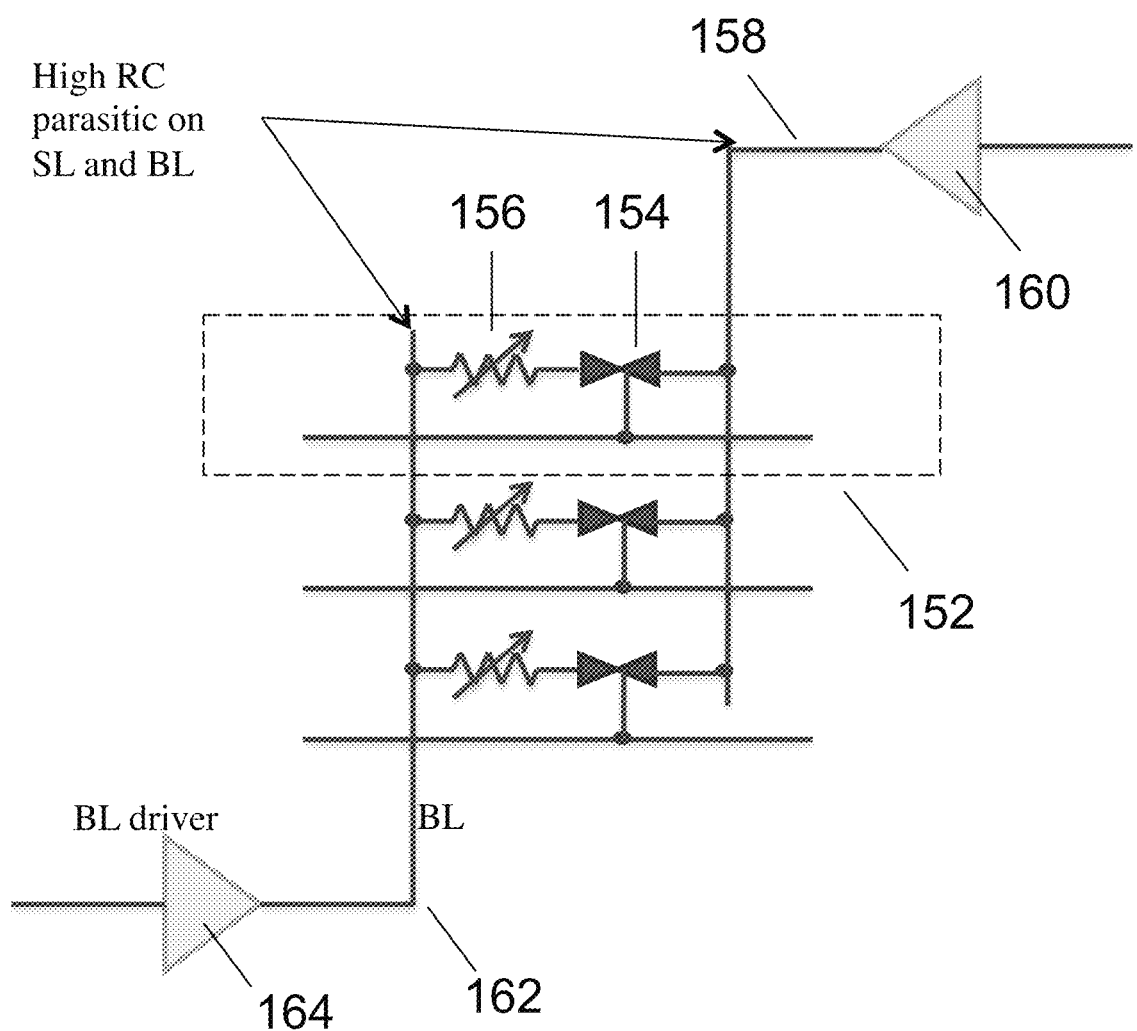
FIG. 1C is a schematic illustrating a memory array.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

FIG. 2 shows a schematic of a circuit arrangement 200 according to various embodiments. The circuit arrangement may include a data cell 202 having a first electrode 202a and a second electrode 202b. The circuit arrangement may include a first transistor 204 having a control electrode 204a, a first controlled electrode 204b and a second controlled electrode 204c. The circuit arrangement may include a second transistor 206 having a control electrode 206a, a first controlled electrode 206b and a second controlled electrode 206c. The first controlled electrode 204b of the first transistor 204 and the first controlled electrode 206b of the second transistor 206 may be coupled to the first electrode 202a of the data cell 202. The second controlled electrode 204c of the first transistor 204 may be configured to electrically connect to a first reference voltage 208 such that the first electrode 202a of the data cell 202 is electrically connected to the first reference voltage 208 via the first transistor 204 when the first transistor 204 is activated by a first word line voltage applied to the control electrode 204a of the first transistor 204a. The second controlled electrode 206c of the second transistor 206 is configured to electrically connect to a second reference voltage 210, such that the first electrode 202a of the data cell 202 is electrically connected to the second reference voltage 210 via the second transistor 206 when the second transistor 206 is activated by a second word line voltage applied to the control electrode 206a of the second transistor 204a.

In other words, the first electrode 202a of the data cell 202, the first controlled electrode 204b of the first transistor 204 and the first controlled electrode 206b of the second transistor 206 may share a common node. The first transistor 204 may be turned on by applying a first word line voltage to the control electrode 204a of the first transistor 204. When the first word line voltage is applied to the control electrode 204a, current may flow through the first transistor 204 due to the potential difference between a first reference voltage 208 (coupled to second controlled electrode 204c) and the common node. The second transistor 206 may be turned on by applying a second word line voltage to the control electrode 206a of the first transistor 206. When the second word line voltage is applied to the control electrode 206a, current may flow through the first transistor 206 due to the potential difference between a second reference voltage 210 (coupled to second controlled electrode 206c) and the common node.

In various embodiments, references to reference voltages may generally include references to reference currents.

"Activated" has the same meaning as being turned on. A transistor that is being activated or turned on is in the active state. In other words, there is a current flowing between the first controlled electrode of the transistor and the second controlled electrode of the transistor. Correspondingly, "deactivated", "not being activated" or "turned off" means that the transistor is in the inactive state. There is no current or an insubstantial current (e.g. subthreshold leakage current) flowing between the first controlled electrode and the second controlled electrode of the transistor. The subthreshold leakage current may be less than about $10^{-12}$ A.

In various embodiments, a "circuit" may be understood as any kind of a logic implementing entity, which may be special purpose circuitry or a processor executing software stored in a memory, firmware, or any combination thereof. Thus, in various embodiments, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java.

In various embodiments, the circuit arrangement may be configured such that data cell 202 is substantially free from current when the first transistor 204 is deactivated and the second transistor 206 is deactivated. In various embodiments, the circuit arrangement may be configured such that the data cell 202 is substantially free from current when the second transistor 206 is activated and a bit line voltage at the second electrode 202b of the data cell 202 is substantially equal to the second reference voltage 210. In various embodiments, the circuit arrangement may be configured such that the data cell 202 is substantially free from current when the first transistor 204 is activated and a bit line voltage at the second electrode 202b of the data cell 202 is substantially equal to the first reference voltage 208.

In various embodiments, the circuit arrangement may further include a column logic circuit coupled to the second electrode 202b of the data cell 202. The column row logic circuit may be configured to switch between accessing a read voltage from and providing a write voltage to the second electrode 202b of the data cell 202.

In various embodiments, the column logic circuit may include a write driver. The write voltage may be provided by the write driver. The write driver may be a voltage mode write driver.

The column row logic circuit may be configured to switch between accessing a read current from and providing a write current to the second electrode 202b of the data cell 202.

In various embodiments, the column logic circuit may include a write driver. The write current may be provided by the write driver. The write driver may be a current mode write driver.

The circuit arrangement may further include a sensing circuit coupled to the column logic circuit. The read voltage may be accessed by the sensing circuit.

The circuit arrangement may also include a column addressing circuit coupled to the column logic circuit. The column addressing circuit may be configured to control whether to provide the write voltage and to access the read voltage.

The circuit arrangement may further include a first word line coupled to the control electrode 204a of the first transistor 204. The circuit arrangement may also include a second word line coupled to the control electrode 206a of the second transistor 206. The first transistor 204 may be activated by the first word line voltage applied to the control electrode 204a of the first transistor 204 via the first word line. The second transistor 206 may be activated by the second word line voltage applied to the control electrode 206a of the second transistor via the second word line.

The circuit arrangement may further include a row logic circuit coupled to the first transistor 204 and coupled to the second transistor 206. The row logic circuit may be configured to control the first word line voltage and the second word line voltage.

The circuit arrangement may also include a row addressing circuit coupled to the row logic circuit. The row addressing circuit may be configured to provide the first word line voltage and the second word line voltage.

The first transistor 204 may be a p-channel metal oxide semiconductor (PMOS) field effect transistor. The second transistor 206 may be a n-channel metal oxide semiconductor (NMOS) field effect transistor. In various alternate embodiments, the first transistor 204 may be a n-channel metal oxide semiconductor (NMOS) field effect transistor and the second transistor 206 may be a n-channel metal oxide semiconductor (NMOS) field effect transistor. In various embodiments, the first transistor and the second transistor may be bipolar junction transistors (BJTs). The first transistor 204 may be a NPN BJT. The second transistor may be a PNP BJT.

In various embodiments, the data cell 202 may be configured to have a first resistance upon flow of the first current though the data cell in the first direction. The data cell 202 may be configured to have a second resistance, the second resistance different from the first resistance, upon flow of the second current though the data cell 202 in the second direction. The data cell 202 may include a magnetic tunneling junction.

Various embodiments may provide a circuit arrangement configured to write to or access from a data cell via a bit line. Various embodiments may remove the requirement of a separate source line (SL). Various embodiments may remove the need for an additional global or column driver for the source line (SL). In various embodiments, the first transistor 204 and the second transistor 206 are embedded bidirectional drivers. Various embodiments may include driver circuits only in the column logic circuit.

Various embodiments may provide a method of writing to or accessing from the data cell using a bit line without a source line. Various embodiments may provide a method of accessing the data cell in a memory array without the need for an additional serial switch such as a transmission gate. Various embodiments may provide a low impedance path through the data cell when the data cell is written to or access from a memory array. Various embodiments may provide a method of writing to or accessing from the data cell using a bit line without a source line and thus reduces the number of interconnects required in the memory array. Various embodiments may provide a method of distributing loading by a global read/write driver coupled to a source line to the memory array without requiring additional transistors in the memory array. Various embodiments may provide a method of integrating transistors for operation during reading/writing into a circuit arrangement including a single data cell. Various embodiments may allow integration of a portion of functions carried out by a source line and circuits associated with the source line into a row logic circuit.

Figure 3A:
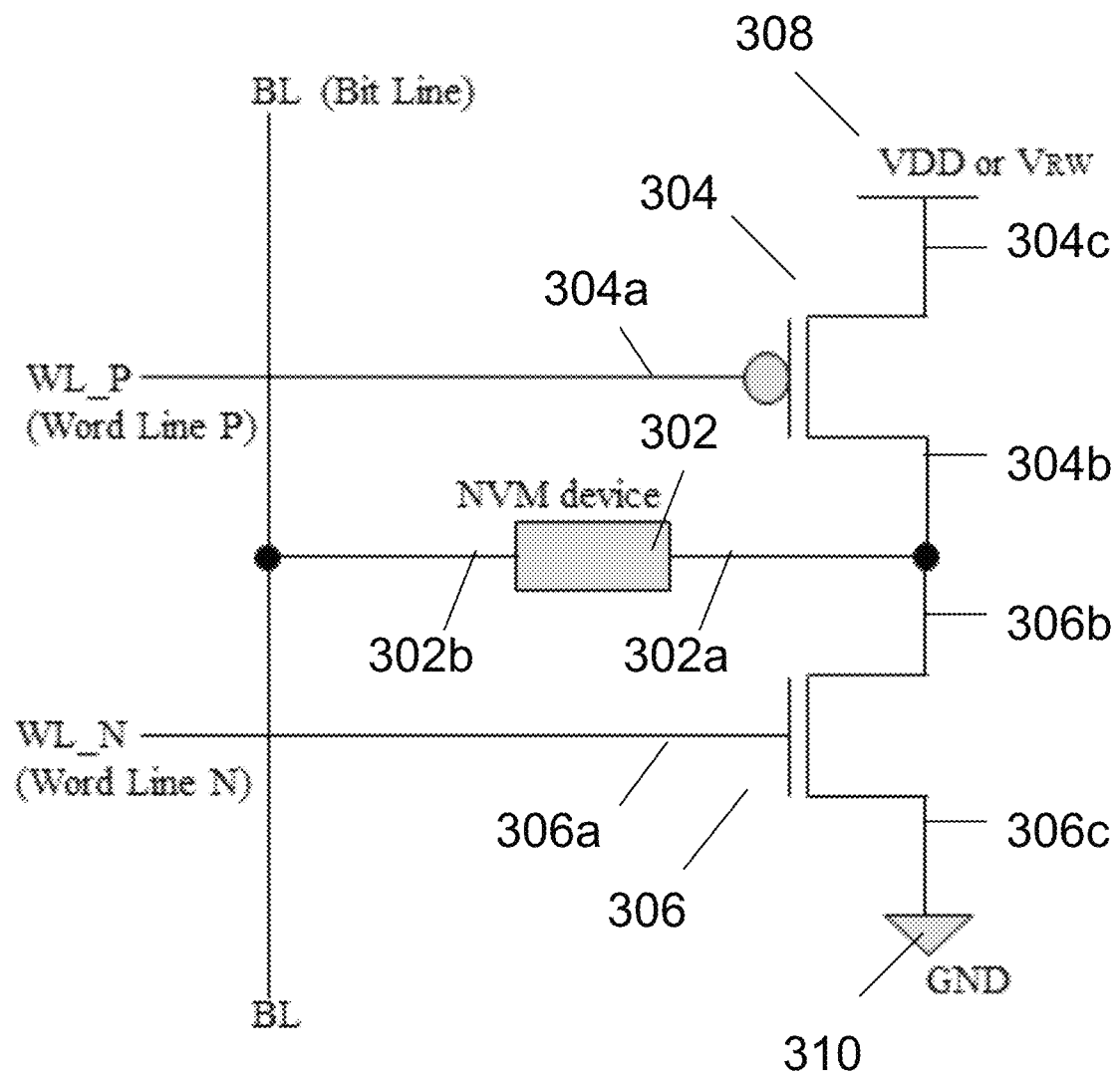
FIG. 3A shows a schematic of a circuit arrangement according to various embodiments.

FIG. 3A shows a schematic of a circuit arrangement 300a according to various embodiments. The circuit arrangement may include a data cell 302 having a first electrode 302a and a second electrode 302b. The circuit arrangement may include a first transistor 304 having a control electrode 304a, a first controlled electrode 304b and a second controlled electrode 304c. The circuit arrangement may include a second transistor 306 having a control electrode 306a, a first controlled electrode 306b and a second controlled electrode 306c. The first controlled electrode 304b of the first transistor 304 and the first controlled electrode 306b of the second transistor 306 may be coupled to the first electrode 302a of the data cell 302. The second controlled electrode 304c of the first transistor 304 may be configured to electrically connect to a first reference voltage 308 such that the first electrode 302a of the data cell 302 is electrically connected to the first reference voltage 308 (or first reference current) via the first transistor 304 when the first transistor 304 is activated by a first word line voltage applied to the control electrode 304a of the first transistor 304a. The second controlled electrode 306c of the second transistor 306 is configured to electrically connect to a second reference voltage 310 (or second reference current), such that the first electrode 302a of the data cell 302 is electrically connected to the second reference voltage 310 via the second transistor 306 when the second transistor 306 is activated by a second word line voltage applied to the control electrode 306a of the second transistor 304a.

In various embodiments, the first reference voltage 308 may be higher than the second reference voltage 310. In various embodiments, the first reference voltage 308 may be VDD or a predetermined high voltage Vrw. In various embodiments, the second reference voltage 310 may be ground. In various embodiments, the first reference current may be higher than the second reference current. The first reference current may be provided by a first current source and the second reference current may be provided by a second current source.

In various embodiments, the first transistor 304 may be a p-channel metal oxide semiconductor (PMOS) field effect transistor. The second transistor 306 may be a n-channel metal oxide semiconductor (NMOS) field effect transistor. In various alternate embodiments, the first transistor 304 may be a NMOS field effect transistor. The second transistor 306 may be a PMOS field effect transistor. In various embodiments, the data cell may be or may include a non-volatile memory. In various embodiments, the data cell may be configured to store a first logic state upon passing a first current through the data cell in a first direction and configured to store a second logic state upon passing a second current through the data cell in a second direction.

Figure 3B:
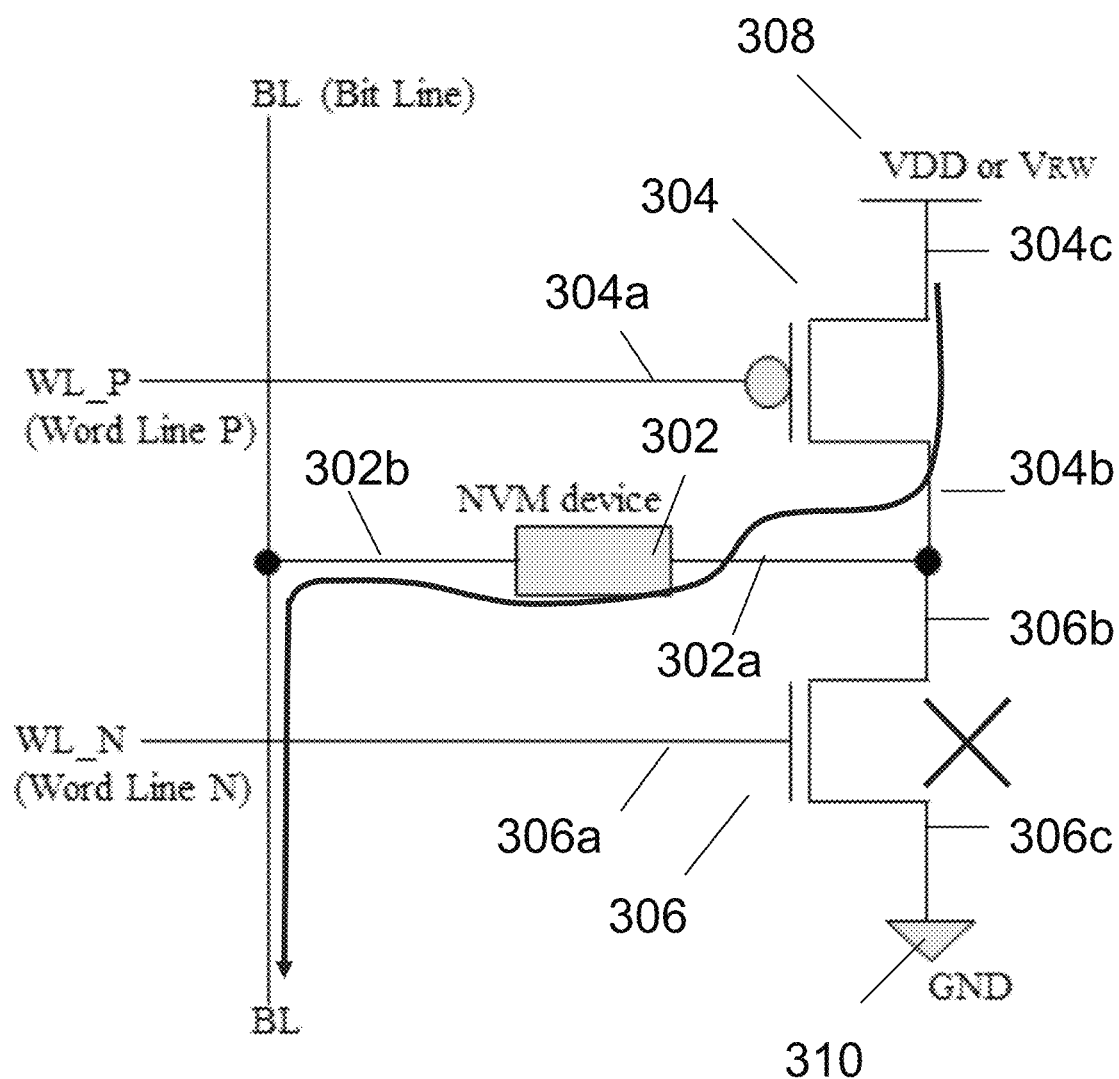
FIG. 3B shows a schematic of the circuit arrangement in FIG. 3A in which the first current flows through the data cell in the first direction when the first transistor 304 is activated.
Figure 3C:
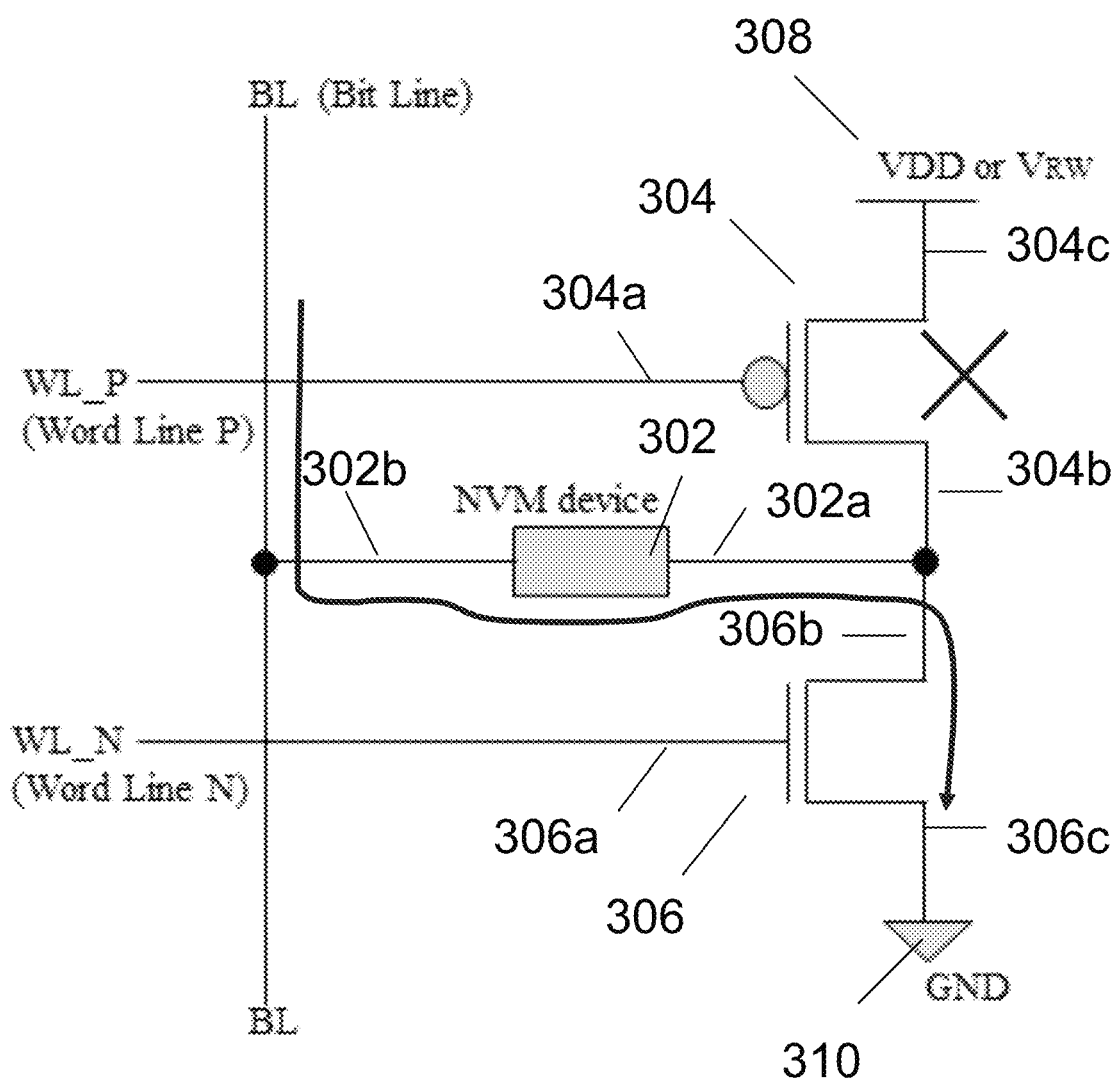
FIG. 3C shows a schematic of the circuit arrangement in FIG. 3A in which the second current flows through the data cell in the second direction when the second transistor is activated.

In various embodiments, the circuit arrangement may be configured such that a first current flows through the data cell 302 in a first direction when the first transistor 304 is activated. The circuit arrangement may be configured such that a second current flows through the data cell 302 in a second direction, the second direction opposite the first direction, when the second transistor 306 is activated. FIG. 3B shows a schematic 300b of the circuit arrangement in FIG. 3A in which the first current flows through the data cell 302 in the first direction when the first transistor 304 is activated. The second transistor 306 may not be activated. As shown in FIG. 3B, the first transistor 304 may be a PMOS transistor and may be activated when the first word line voltage applied to the control electrode 304a of the first transistor 304 is low. The second transistor 306 may be a NMOS transistor and may be deactivated or may be not activated when the second word line voltage applied to the control electrode 306a of the second transistor 306 is low. FIG. 3C shows a schematic 300c of the circuit arrangement in FIG. 3A in which the second current flows through the data cell 302 in the second direction when the second transistor 306 is activated. The first transistor 304 may not be activated. As shown in FIG. 3C, the PMOS transistor 304 may be deactivated or may not be activated when the first word line voltage applied to the control electrode 304a of the first transistor 304 is high. The NMOS transistor 306 may be activated when the second word line voltage applied to the control electrode 306a of the second transistor 306 is high.

"Activated" has the same meaning as being turned on. A transistor that is being activated or turned on is in the active state. In other words, there is a current flowing between the first controlled electrode of the transistor and the second controlled electrode of the transistor. Correspondingly, "deactivated", "not being activated" or "turned off" means that the transistor is in the inactive state. There is no current or an insubstantial current (e.g. subthreshold leakage current) flowing between the first controlled electrode and the second controlled electrode of the transistor. The subthreshold leakage current may be less than about $10^{-12}$ A.

The data cell 302 may be configured to have a first resistance upon flow of the first current though the data cell 302 in the first direction. The data cell 302 may be configured to have a second resistance, the second resistance different from the first resistance, upon flow of the second current though the data cell 302 in the second direction. The data cell 306 may include a magnetic tunneling junction (MTJ). The circuit arrangement may be or may include a STT-MRAM memory cell.

Figure 3D:
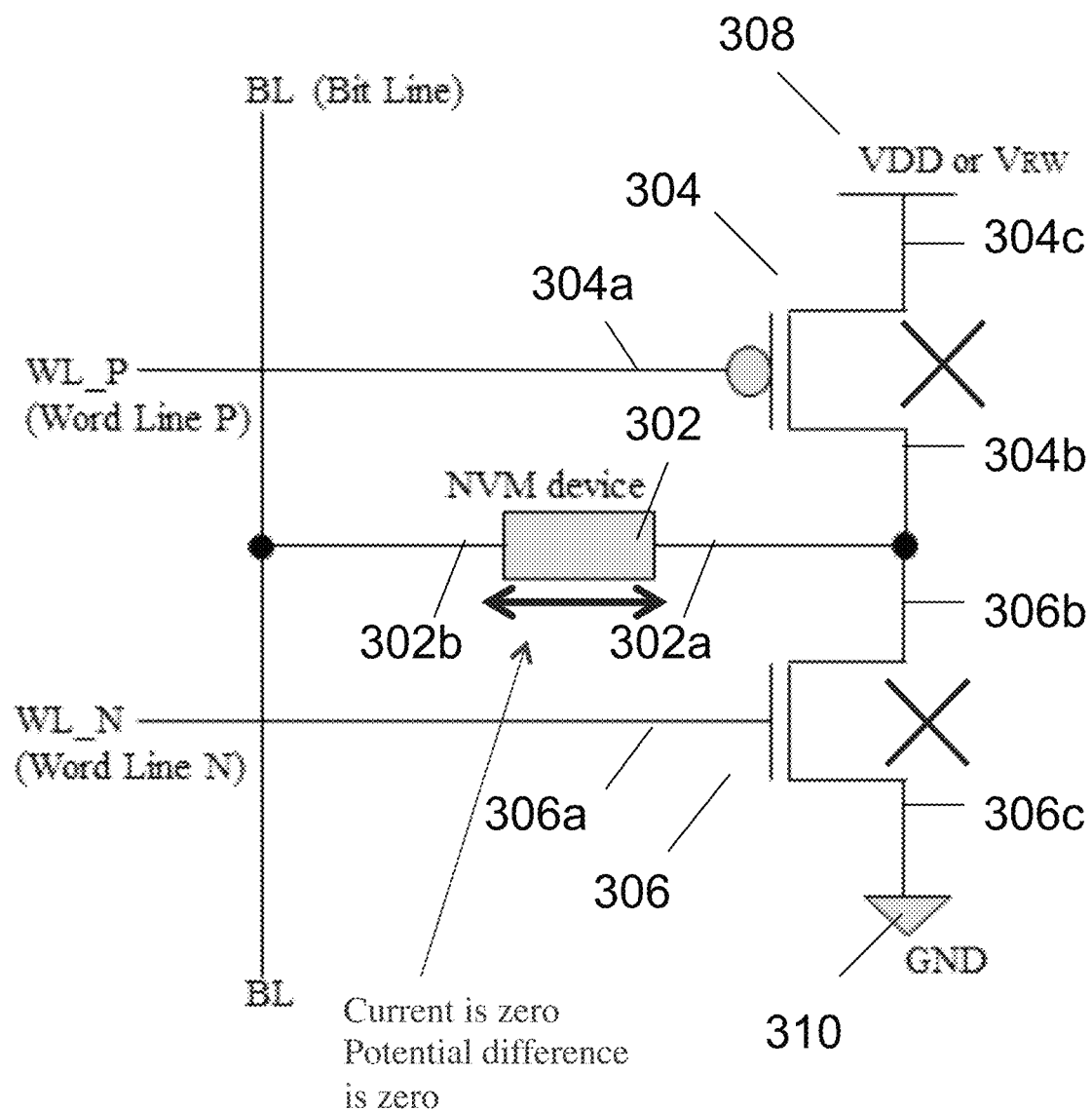
FIG. 3D shows a schematic of the circuit arrangement in FIG. 3A in which the first transistor is deactivated and the second transistor is deactivated.

In various embodiments, the circuit arrangement may be configured such that data cell 302 is substantially free from current when the first transistor 304 is deactivated and the second transistor 306 is deactivated. In other words, when the first transistor 304 is not turned on and the second transistor 306 is not turned on, no current or an insubstantial current flow through the data cell 302. FIG. 3D shows a schematic 300d of the circuit arrangement in FIG. 3A in which the first transistor 304 is deactivated and the second transistor 306 is deactivated. Additionally or alternatively, the circuit arrangement may be configured such that the data cell 302 is substantially free from current when the second transistor 306 is activated and a bit line voltage (or current) at the second electrode 302b of the data cell 302 is substantially equal to the second reference voltage (or current). The circuit arrangement may also be configured such that the data cell 302 is substantially free from current when the first transistor 304 is activated and a bit line voltage (or current) at the second electrode 302b of the data cell 302 is substantially equal to the first reference voltage (or current).

Figure 4:
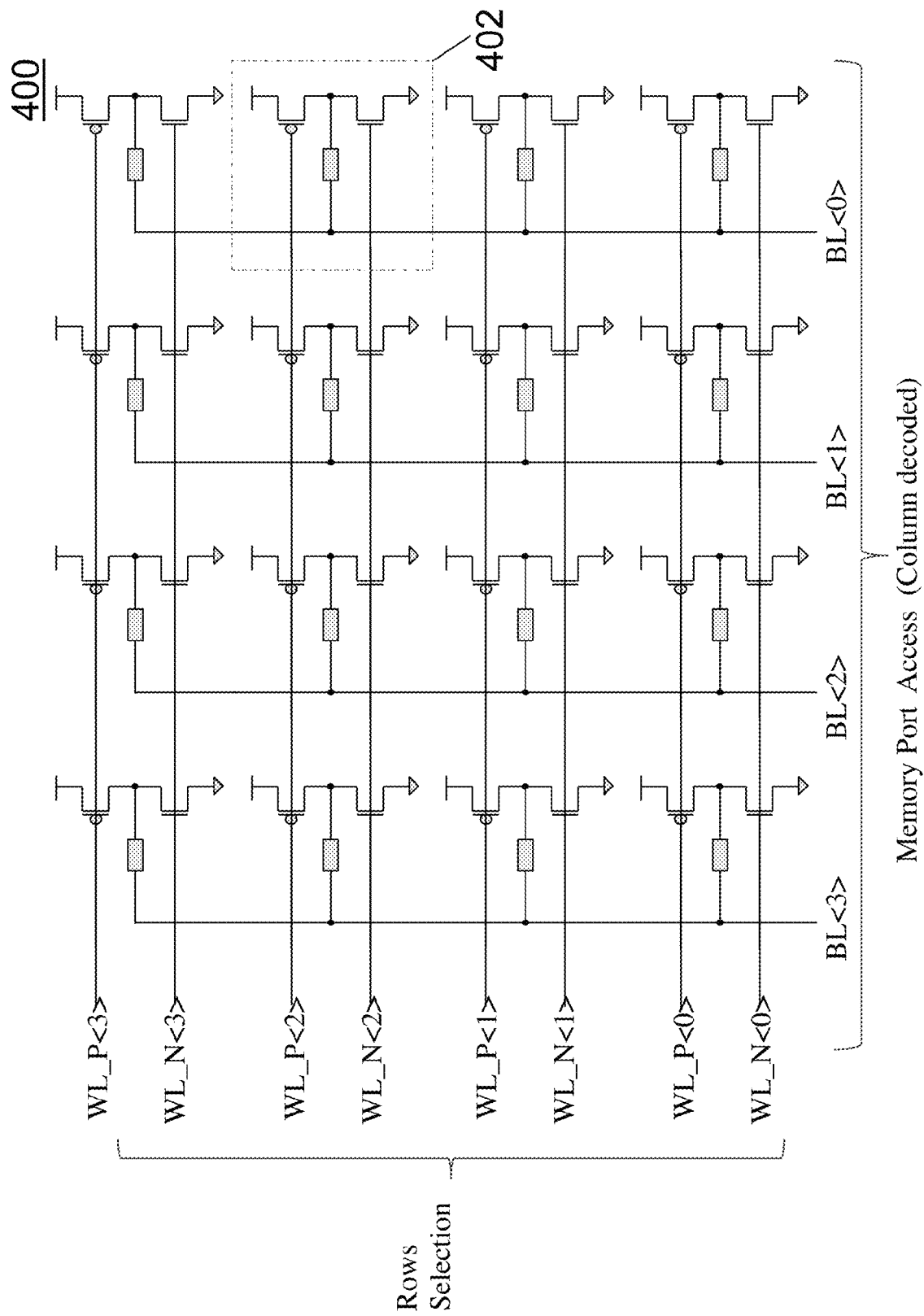
FIG. 4 is a schematic showing a memory array according to various embodiments.

FIG. 4 is a schematic 400 showing a memory array according to various embodiments. The memory array may include a plurality of circuit arrangements. Each circuit arrangement may correspond to the circuit arrangement as shown in FIG. 2. The memory array may also be divided into columns and rows. A circuit arrangement, i.e. a memory cell 402, in the memory array may be addressed via row and column selection. One memory cell 402 out of the plurality of memory cells may be selected by applying appropriate voltages (or currents) to the corresponding column and row. Each circuit arrangement or memory cell 402 may include one bit line and two word lines. Addressing the memory cell 402 may include applying suitable high and/or low voltages (or currents) to the corresponding bit line and word lines of the memory cell.

Figure 5A:
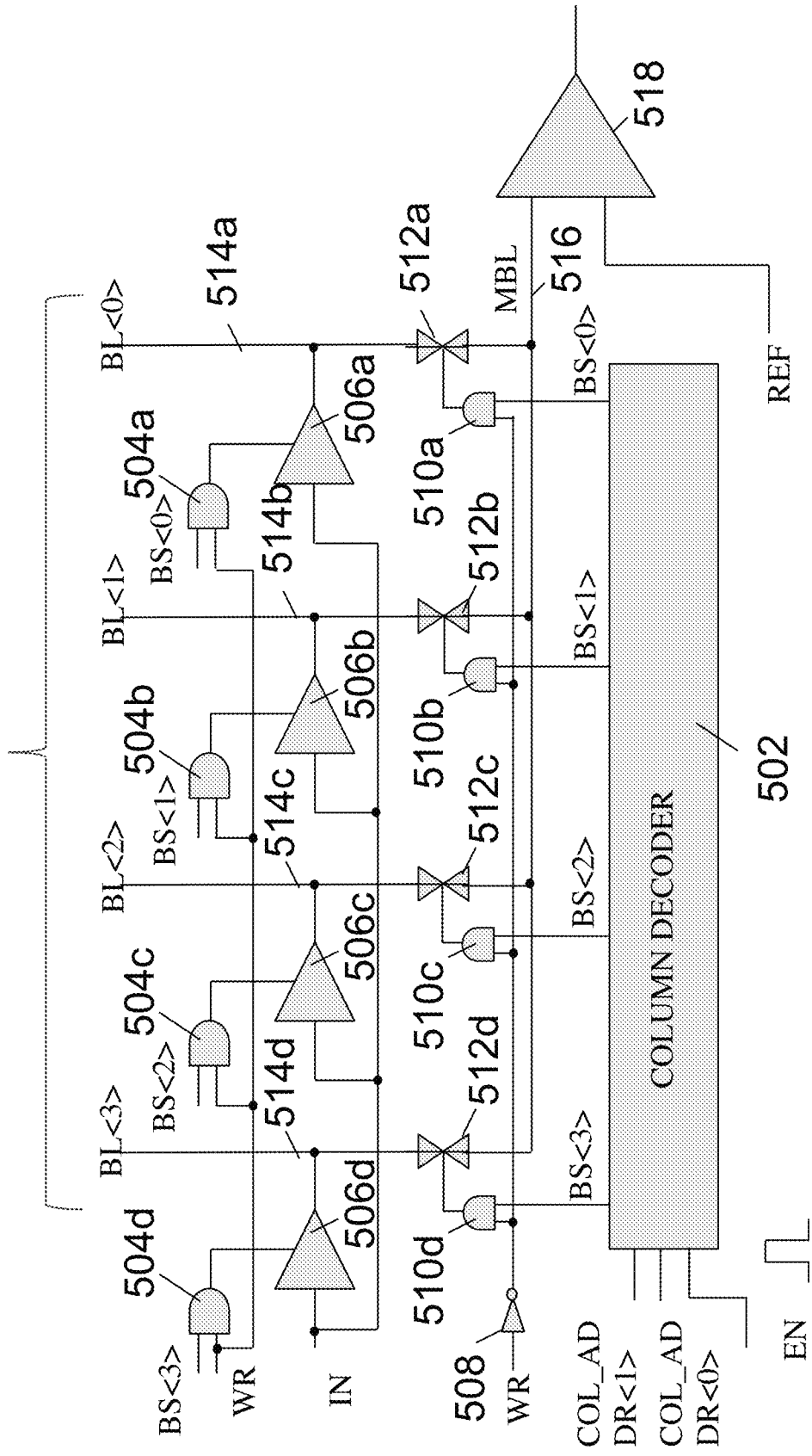
FIG. 5A is a schematic showing a column logic circuit according to various embodiments.

FIG. 5A is a schematic 500a showing a column logic circuit according to various embodiments. The column logic circuit may be coupled to the second electrode (e.g. 302b as shown in FIGS. 3A-D) of the data cell. The circuit arrangement may further include a column addressing circuit 502 coupled to the column logic circuit. The column addressing circuit 502 may also be referred to as a column decoder. The column addressing circuit 502 may be configured to provide bit selection signals BS<0>, BS<1>, BS<2> or BS<3> to the column logic circuit for selecting a column in the memory array. For instance, if column 0 in the memory array is to be selected, the column addressing circuit 502 may set BS<0> to high and BS<1>, BS<2> and BS<3> to low. If column 1 is to be selected instead, the column addressing circuit 502 may set BS<1> to high and BS<0>, BS<2> and BS<3> to low. In other words, the column addressing circuit 502 may be configured to control whether to provide the write voltage and to access the read voltage. Whether to provide the write voltage to or whether to access the read voltage from a particular column (and a data cell along the particular column) may be determined by the column addressing circuit 502. The column addressing circuit 502 may be configured to provide the bit selection signals based on the column addressing signals COL_ADDR <0> and COL_ADDR <1> applied to the column addressing circuit 502.

In various embodiments, a bit line voltage (or current) at the second electrode of the data cell may be configured to switch between a write voltage (or current) provided by the column logic circuit and a read voltage (or current) accessed by the column logic circuit. The bit line voltages in FIG. 5A are BL<0>, BL<1>, BL<2> and BL<3>. The switching between the read voltage (or current) and the write voltage (current) may be controlled by the column logic circuit. In other words, the column row logic circuit may be configured to switch between accessing a read voltage from and providing a write voltage to the second electrode of the data cell. In various alternate embodiments, the column row logic circuit may be configured to switch between accessing a read current from and providing a write current to the second electrode of the data cell.

The switching may be controlled by a write-read (WR) signal applied to the column logic circuit. During writing, WR signals to AND gates 504a, 504b, 504c 504d are set to high.

Each AND gate may correspond to one respective column in the memory array. When a bit selection signal BS<0>, BS<1>, BS<2> or BS<3> from the column addressing circuit 502 to one AND gate of the plurality of AND gates 504a, 504b, 504c 504d is set to high (and the remaining AND gates are set to low), the corresponding driver enable signal is also set to high. For instance, when WR is set to high and BS<0> is set to high while BS<1>, BS<2> and BS<3> are set to low, only the driver enable signal from AND gate 504a is set to high. The driver enable signals from AND gates 504b, 504c, 504d are set to low. When the driver enable signal from AND gate 504a is set to high, the corresponding driver circuit 506a is enabled. As the driver enable signals from the remaining AND gates 504b, 504c, 504d are set to low, the driver circuits 506b, 506c, 506d are not enabled.

Figure 5B:
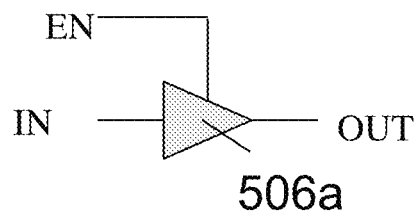
FIG. 5B shows a driver circuit as shown in FIG. 5A according to various embodiments.

In various embodiments, the write voltages (or currents) may be provided by the driver circuits 506a, 506b, 506c, 506d. Each driver circuit may be configured to provide a write voltage (or current) to the second electrode of a corresponding data cell. The driver circuit may be configured to be enabled based on a WR signal and a bit selection signal (e.g. BS<0>, BS<1>, BS<2> or BS<3>). The driver circuit may be configured to provide the write voltage (or current) based on a data input signal, i.e. IN. FIG. 5B shows a driver circuit 506a as shown in FIG. 5A according to various embodiments.

Figure 5C:
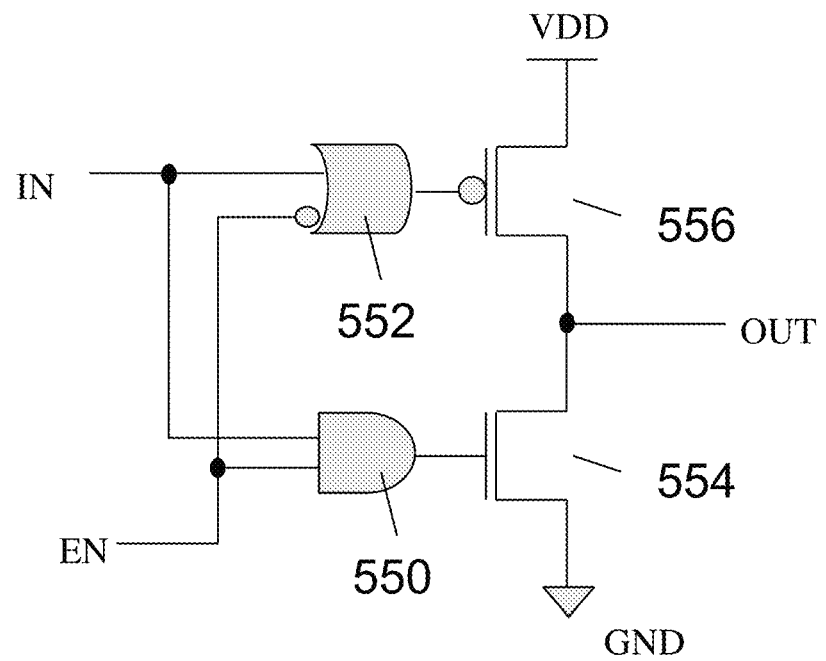
FIG. 5C shows a first implementation of the driver circuit according to various embodiments.

FIG. 5C shows a first implementation of the driver circuit according to various embodiments. The driver circuit may include a AND gate 550 and a OR gate with an active low input 552 (for the driver enable signal EN). Structure 552 may be realized by coupling a NOT gate to an input terminal of a OR gate. The driver circuit may further include a NMOS transistor 554 coupled to the output terminal of structure 550. The output terminal of structure 550 may be coupled to the control electrode of NMOS transistor 554. The driver circuit may also include a PMOS transistor 556 coupled to the output terminal of structure 552. The output terminal of structure 552 may be coupled to the control electrode of PMOS transistor 556. The first controlled electrode of the PMOS transistor 556 and the first controlled electrode of the NMOS transistor 554 may be coupled to the bit line (e.g. 514a). The second controlled electrode of the PMOS transistor 556 may be coupled to the first reference voltage such as VDD. The second controlled electrode of the NMOS transistor 554 may be coupled to the second reference voltage such as ground.

Structure 550 may output a high voltage at the output terminal of structure 550 only when driver enable signal EN is high and data input signal IN is high. The high voltage outputted by structure 550 may activate NMOS transistor 554. Consequently, the bit line signal (i.e. OUT) at the bit line (e.g. 514a) may be set to the second reference voltage (e.g. ground). Structure 552 may output a low voltage at the output terminal of structure 552 only when driver enable signal EN is high and data input signal IN is low. The low voltage outputted by structure 552 may activate PMOS transistor 556. Consequently, the bit line voltage (i.e. OUT) at the bitline (e.g. 514a) may be set to the first reference voltage (e.g. VDD).

Figure 5D:
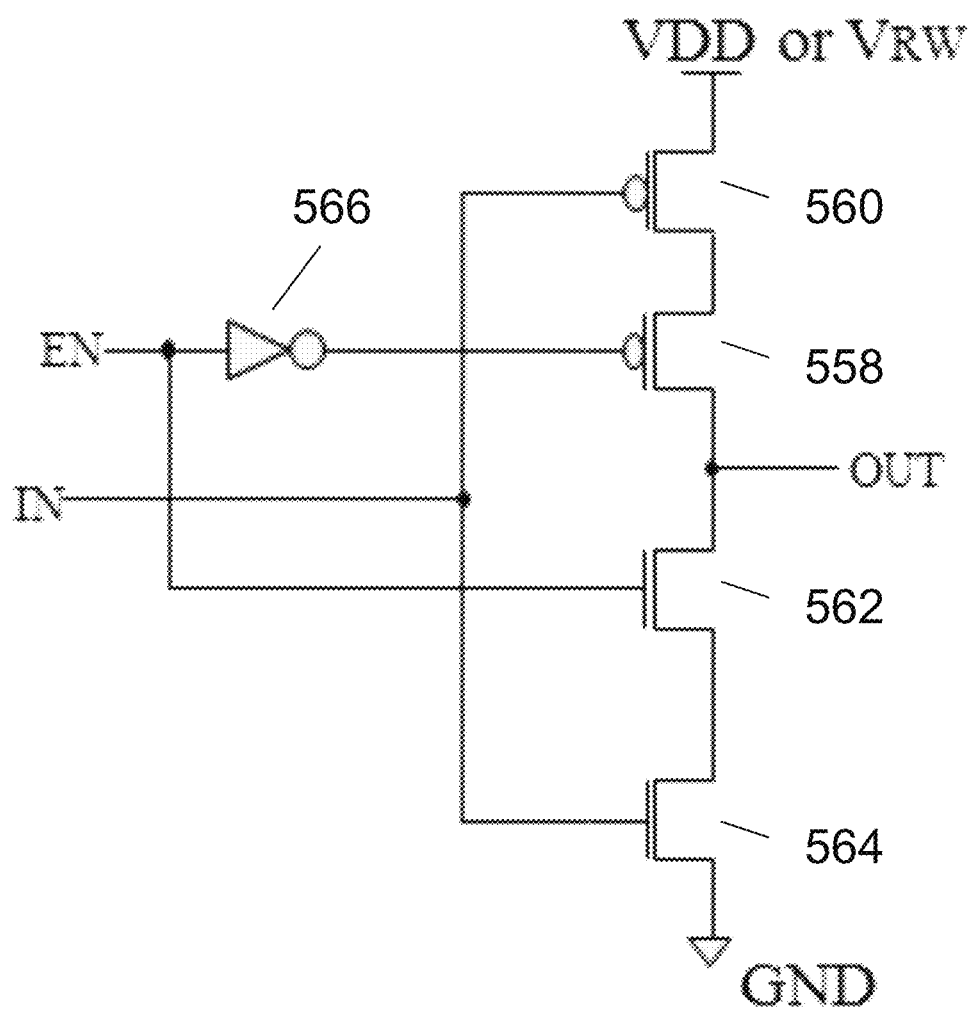
FIG. 5D shows a second implementation of the driver circuit according to various embodiments.

FIG. 5D shows a second implementation of the driver circuit according to various embodiments. The driver circuit may include a first PMOS transistor 558 serially connected to a second PMOS transistor 560. The second controlled electrode of the first PMOS transistor 558 may be coupled to the first controlled electrode of the second PMOS transistor 560. The second controlled electrode of the second PMOS transistor may be coupled to the first reference voltage (e.g. VDD or Vrw). The driver circuit may further include a first NMOS transistor 562 serially connected to a second NMOS transistor 564. The second controlled electrode of the first NMOS transistor 562 may be coupled to the first controlled electrode of the second NMOS transistor 564. The second controlled electrode of the second NMOS transistor 564 may be coupled to the second reference voltage (e.g. ground). The first controlled electrode of the first PMOS transistor 558 and the first controlled electrode of the first NMOS transistor 562 may be coupled to the bit line. An output terminal of a NOT gate 566 may be coupled to the control electrode of the first PMOS transistor 558.

The driver enable signal EN may be coupled to the input terminal of the NOT gate 566. The driver enable signal EN may also be coupled to the control electrode of the first NMOS transistor 562. As such, when driver enable signal EN is set to high, both the first PMOS transistor 558 and the first NMOS transistor 562 are activated. Conversely, when the driver enable signal EN is set to low, both the first PMOS transistor 558 and the first NMOS transistor 562 are not activated or deactivated.

The data input signal IN may be coupled to the control electrode of the second PMOS transistor 560 and the control electrode of the second NMOS transistor 564. The driver circuit may be configured that the second PMOS transistor 560 may be activated when the second NMOS transistor 564 is not activated or deactivated. Conversely, the driver circuit may be configured such that the second PMOS transistor 560 may be not activated or deactivated when to second NMOS transistor 564 is activated. When the data input signal IN is set to high, the second PMOS transistor 560 is deactivated or not activated and the second NMOS transistor 564 is activated. Consequently, the bit line signal (i.e. OUT) at the bitline may be set to the second reference voltage (e.g. ground). When the data input signal IN is set to low, the second PMOS transistor 560 is activated and the second NMOS transistor 564 is deactivated or not activated. Consequently, the bit line voltage (i.e. OUT) at the bitline may be set to the first reference voltage (e.g. VDD or Vrw).

Figure 5E:
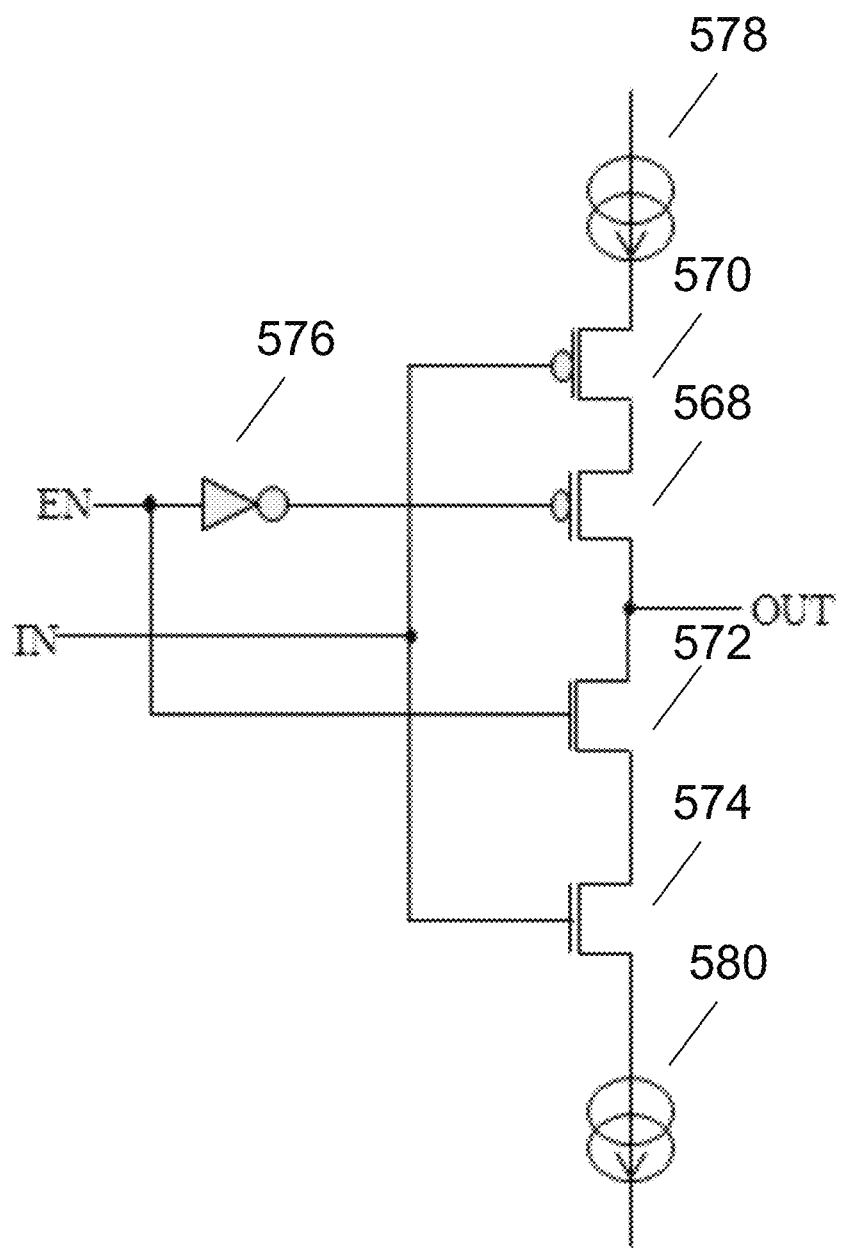
FIG. 5E shows a third implementation of the driver circuit according to various embodiments.

FIG. 5E shows a third implementation of the driver circuit according to various embodiments. The third implementation is similar to the second implementation by except the first reference voltage is replaced by a first reference current 578 and the second reference voltage is replaced by a second reference current 580. The driver circuit may include a first PMOS transistor 568 serially connected to a second PMOS transistor 570. The second controlled electrode of the first PMOS transistor 568 may be coupled to the first controlled electrode of the second PMOS transistor 570. The second controlled electrode of the second PMOS transistor 570 may be coupled to the first reference current 578. The driver circuit may further include a first NMOS transistor 572 serially connected to a second NMOS transistor 574. The second controlled electrode of the first NMOS transistor 572 may be coupled to the first controlled electrode of the second NMOS transistor 574. The second controlled electrode of the second NMOS transistor 574 may be coupled to the second reference current 580. The first controlled electrode of the first PMOS transistor 568 and the first controlled electrode of the first NMOS transistor 572 may be coupled to the bit line. An output terminal of a NOT gate 576 may be coupled to the control electrode of the first PMOS transistor 568.

The driver enable signal EN may be coupled to the input terminal of the NOT gate 576. The driver enable signal EN may also be coupled to the control electrode of the first NMOS transistor 572. As such, when driver enable signal EN is set to high, both the first PMOS transistor 568 and the first NMOS transistor 572 are activated. Conversely, when the driver enable signal EN is set to low, both the first PMOS transistor 568 and the first NMOS transistor 572 are not activated or deactivated.

The data input signal IN may be coupled to the control electrode of the second PMOS transistor 570 and the control electrode of the second NMOS transistor 574. The driver circuit may be configured that the second PMOS transistor 570 may be activated when the second NMOS transistor 574 is not activated or deactivated. Conversely, the driver circuit may be configured such that the second PMOS transistor 570 may be not activated or deactivated when to second NMOS transistor 574 is activated. When the data input signal IN is set to high, the second PMOS transistor 570 is deactivated or not activated and the second NMOS transistor 574 is activated. Consequently, the bit line signal (i.e. OUT) at the bitline may be set to the current provided by the second reference current 580. When the data input signal IN is set to low, the second PMOS transistor 570 is activated and the second NMOS transistor 574 is deactivated or not activated. Consequently, the bit line current at the bitline may be set to the current provided by the first reference current 578. The bit line current provided by the first reference current 578 and the bit line current provided by the second reference current 580 may be in opposite direction.

Returning to FIG. 5A, when a driver circuit (e.g. 504a) is enabled based on a WR signal and a bit selection signal, the driver circuit (e.g. 504a) may set the bitline voltage or the bitline current at the output of the driver circuit (e.g. 504a) based on the data input signal IN. The driver circuit (e.g. 504a) may be a voltage mode driver such as the driver circuits shown in FIGS. 5C and 5D or a current mode driver such as the driver circuit shown in FIG. 5E.

As such, in various embodiments, a bit line voltage at the second electrode of the data cell may be configured to switch between a write voltage provided by the column logic circuit and a read current accessed by the column logic circuit. The switching between the read voltage and the write voltage may be controlled by the column logic circuit. The column logic circuit may include a write driver (e.g. 504a). The write voltage may be provided by the write driver (e.g. 504a). The write driver (e.g. 504a) may be a voltage mode write driver.

In various embodiments, a bit line current at the second electrode of the data cell may be configured to switch between a write current provided by the column logic circuit and a read current accessed by the column logic circuit. The switching between the read current and the write current may be controlled by the column logic circuit. The column logic circuit may include a write driver (e.g. 504a). The write current may be provided by the write driver (e.g. 504a). The write driver (e.g. 504a) may be a current mode write driver.

In other words, the column row logic circuit may be configured to switch between accessing a read voltage from and providing a write voltage to a second electrode of the data cell. In various embodiments, the column logic circuit may include a write driver. The write voltage may be provided by the write driver. The write driver may be a voltage mode write driver. In various alternate embodiments, the column logic circuit may include a write driver. The write current may be provided by the write driver. The write driver may be a current mode write driver.

In various embodiments, the WR signal may further be coupled to an input terminal of a NOT gate 508. The output terminal of the NOT gate 508 may be coupled to first input terminals of AND gates 510a, 510b, 510c, 510d. The column addressing circuit 502 may be coupled to the second input terminals of AND gates 510a, 510b, 510c, 510d. Each output terminal of AND gates 510a, 510b, 510c, 510d may be coupled to switch structures 512a, 512b, 512c, 512d. Each switch structures 512a, 512b, 512c, 512d couples a corresponding bitline to the main bit line (MBL) 516. For instance, structure 512a couples bitline 514a to the MBL 516, structure 512b couples bitline 514b to the MBL 516, structure 512c couples bitline 514c to the MBL 516 and structure 512d couples bitline 512d to the MBL 516. Each structure 512a, 512b, 512c or 512d may be configured such that when a high signal is applied to the structure, the structure allows flow of current from the corresponding bit line to the MBL. Conversely, when a low signal is applied to the structure, the structure may substantially stop flow of current from the corresponding bit line to the MBL. In other words, when a switch structure is disabled, the bitlines 514a, 514b, 514c, 514d may be electrically isolated from the MBL 516. The sensing circuit coupled to the MBL 516 may also be electrically isolated from the bitlines 514a, 514b, 514c, 514d.

During writing, the WR signal may be high. As such, the signal at the output terminal of NOT gate 508 may be low and the output terminals at AND gates 510a, 510b, 510c, 510d may be low. The bitlines 514a, 514b, 514c, 514d may be thus electrically isolated from the MBL 516 by structures 512a, 512b, 512c and 512d.

During reading, the column addressing circuit 502 may be configured to provide bit selection signals BS<0>, BS<1>, BS<2> or BS<3> to the column logic circuit for selecting a column in the memory array. The column addressing circuit 502 may be configured to provide the bit selection signals to the respective AND gates 510a, 510b, 510c, 510d. For instance, the column addressing circuit 502 may be configured to provide bit selection signal BS<0> to AND gate 510a for selecting column 0 in the memory array, the column addressing circuit 502 may be configured to provide bit selection signal BS<1> to AND gate 510b for selecting column 1 in the memory array, the column addressing circuit 502 may be configured to provide bit selection signal BS<2> to AND gate 510c for selecting column 2 in the memory array and the column addressing circuit 502 may be configured to provide bit selection signal BS<3> to AND gate 510c for selecting column 3 in the memory array.

The column logic circuit may be configured to provide a writing voltage or writing current to the circuit arrangement addressed by the column addressing circuit 502 during writing (WR is high). The writing voltage or writing current provided by the column logic circuit may be based on the data input signal IN. The column logic circuit may be further configured not to provide the writing current or writing voltage (i.e. the writing current or writing voltage is substantially zero) when the circuit arrangement is not addressed by the column addressing circuit. The column logic circuit may be configured to electrically isolate the sensing circuit from the writing current or writing voltage during writing.

During reading, the WR signal may be low. As such, the signal at the output terminal of NOT gate 508 may be high.

Consequently, the output terminals at AND gates 510a, 510b, 510c or 510d may be high if the corresponding selection signal BS<0>, BS<1>, BS<2> or BS<3> applied to the second input terminals of corresponding AND gates 510a, 510b, 510c or 510d is high. For instance, if selection signal BS<0> is set by the column addressing circuit 502 to high while the remaining selection signals BS<1>, BS<2> and BS<3> are set to low, the output terminal of AND gate 510a may be high while the output terminals at AND gates 510b, 510c and 510d may be low.

When the output terminal of an AND gate (e.g. 510a, 510b, 510c or 510d) is set to high, the corresponding switch structure (e.g. 512a, 512b, 512c or 512d) is enabled and allows current to flow from the corresponding bitline (e.g. 514a, 514b, 514c, 514d) to the MBL 516. For instance, when the output terminal of AND gate 510a is set to high, the switch structure 512a is set to high, the structure 512a is enabled and current flows from bit line 514a to the MBL 516.

In various embodiments, the circuit arrangement may further include sensing circuit coupled to the column logic circuit. The read voltage or read current may be accessed by the sensing circuit. The sensing circuit may include a sensing amplifier 518. The MBL 516 may be coupled to a first input terminal of the sensing amplifier 518. A read reference voltage or a read reference current REF may be coupled to a second input terminal of the sensing amplifier 618. The sensing amplifier 518 may be configured to compare the voltage or current in the MBL 516 with the reference voltage or reference current REF. The sensing amplifier 518 may be configured to output a logic state (e.g. a high state or a low state) depending on whether the read voltage (or read current) is above or below the read reference voltage (or read reference current). In other words, the sensing circuit may be a voltage sensing circuit or a current sensing circuit. A voltage sensing circuit may be configured to access the read voltage in the MBL 516 and to compare the read voltage with a read reference voltage. A current sensing circuit may be configured to access the read current in the MBL 516 and to compare the read current with the read reference current in the MBL 516.

Also, as the WR signal is low during reading, the output terminals of the AND gates 504a 504b, 504c, 504d are low and the driver circuits 506a, 506b, 506c, 506d are disabled. Consequently, the write voltages are not outputted to any of the bitlines 514a, 514b, 514c, 514d during reading.

The column logic circuit may be configured to electrically connect the sensing circuit with the circuit arrangement addressed by the column addressing circuit 502 during reading (WR is low). The column logic circuit may be configured to electrically isolate the sensing circuit from the circuit arrangement not addressed by the column addressing circuit during reading. The column logic circuit may also be configured to disable to deactivate all driver circuits during reading so that there is no writing voltage or writing current applied to the circuit arrangement.

Figure 11:
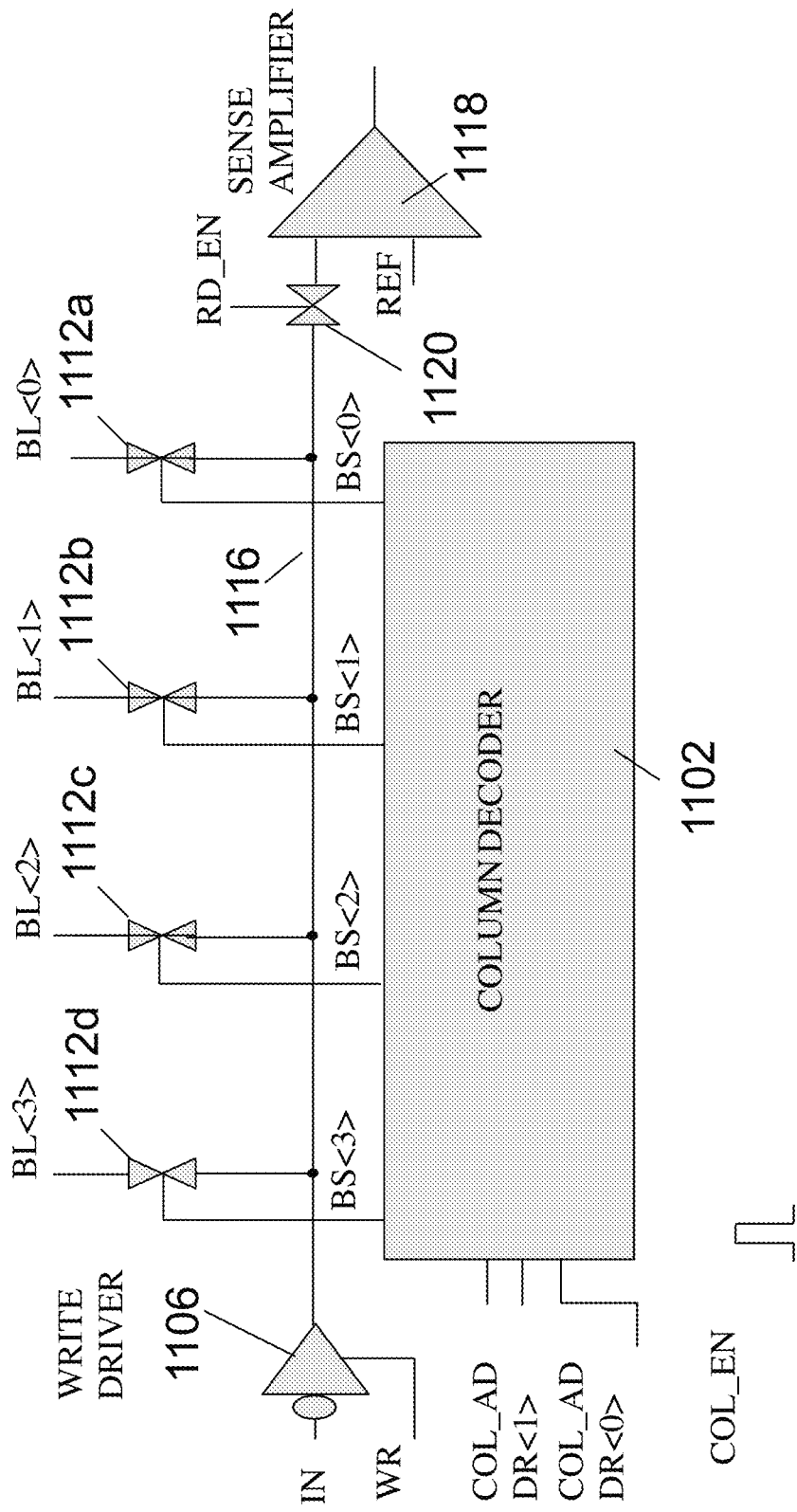
FIG. 11 is a schematic showing a column logic circuit according to various embodiments.

FIG. 11 is a schematic 1100 showing a column logic circuit according to various embodiments. The column logic circuit may be coupled to the second electrode (e.g. 302b as shown in FIGS. 3A-D) of the data cell. The column circuit may be an alternative to the column circuit shown in FIG. 5A. The circuit arrangement may further include a column addressing circuit 1102 coupled to the column logic circuit. The column addressing circuit 1102 may also be referred to as a column decoder. The column addressing circuit 1102 may be configured to provide bit selection signals BS<0>, BS<1>, BS<2> or BS<3> to the column logic circuit for selecting a column in the memory array. For instance, if column 0 in the memory array is to be selected, the column addressing circuit 1102 may set BS<0> to high and BS<1>, BS<2> and BS<3> to low. If column 1 is to be selected instead, the column addressing circuit 1102 may set BS<1> to high and BS<0>, BS<2> and BS<3> to low. In other words, the column addressing circuit 1102 may be configured to control whether to provide the write voltage and to access the read voltage. Whether to provide the write voltage to or whether to access the read voltage from a particular column (and a data cell along the particular column) may be determined by the column addressing circuit 1102. The column addressing circuit 1102 may be configured to provide the bit selection signals based on the column addressing signals COL_ADDR <0> and COL_ADDR <1> applied to the column addressing circuit 1102.

The column addressing circuit may be coupled to the bidrectional diode structures 1112a, 1112b, 1112c, 1112d. The column addressing circuit 1102 may be configured to provide the write voltage and to access the read voltage by controlling the structures 1112a, 1112b, 1112c, 1112d. For instance, if column 0 in the memory array is to be selected, the column addressing circuit 1102 may set BS<0> to high. Setting BS<0> to high may enable structure 1112a and allow current to flow through structure 1112a. On the other hand, BS<1>, BS<2> and BS<3> may be set to low, which disable structures 1112b, 1112c, 1112d. The structures 1112b, 1112c, 1112d may not allow currents to flow through and bitlines BL<1>, BL<2>, BL<3> are isolated from the main bit line 1116.

In various embodiments, a bit line voltage (or current) at the second electrode of the data cell may be configured to switch between a write voltage (or current) provided by the column logic circuit and a read voltage (or current) accessed by the column logic circuit. The bit line voltages in FIG. 11 are BL<0>, BL<1>, BL<2> and BL<3>. The switching between the read voltage (or current) and the write voltage (current) may be controlled by the column logic circuit. In other words, the column row logic circuit may be configured to switch between accessing a read voltage from and providing a write voltage to the second electrode of the data cell. In various alternate embodiments, the column row logic circuit may be configured to switch between accessing a read current from and providing a write current to the second electrode of the data cell. The driver circuit 1106 may be a voltage mode write driver or a current mode write driver.

The switching may be controlled by a write-read (WR) signal applied to the column logic circuit. In various embodiments, the write voltages (or currents) may be provided by the driver circuit 1106. During writing, WR signal to driver circuit (write driver) 1106 may be set to high. The WR signal may enable the driver circuit 1106. The input terminal of driver circuit 1106 may be coupled with a NOT gate. When the WR signal is low, the output terminal of the driver circuit 1106 may be high (e.g. VDD or Vrw). When the WR signal is high, the output terminal of the driver circuit 1106 may be low (e.g. ground). When the corresponding bit selection signal is selected to high, the current or voltage at the output terminal of the driver circuit 1106 may be transmitted to the corresponding bitline. For instance, if BS<0> is high and BS<1>, BS<2> and BS<3> are low, structure 1112a may be enabled and structures 1112b, 1112c, 1112d may be disabled. The voltage or current at the output terminal of driver circuit 1106 may be transmitted to BL<0>. BL<1>, BL<2> and BL<3> may remain electrically isolated from the driver circuit 1106 due to structures 1112b, 1112c, 1112d.

The RD_EN signal may be set to low during writing. Bidirectional diode structure 1120 may be set to low. Sensing amplifier 1118 may be electrically isolated from the writing current or voltages on the main bit line 1116.

During reading, the RD_EN signal may be set to high and the WR signal may be set to low. The write driver 1106 may be disabled. When the column addressing circuit 1102 determines to read a current from the data cell coupled to a bitline, for instance BL<0>, the column addressing circuit 1102 may set BS<0> to high and BS<1>, BS<2> and BS<3> to low. Structure 1112a may be enabled and structures 1112b, 1112c, 1112d may be disabled. The voltage or current at the second electrode of the data cell coupled to BL<0> may be transmitted to main bit line 1116. As structure 1120 is enable by the RD_EN signal, the voltage or current may be sensed by the sensing amplifier 1118.

FIG. 6 is a schematic 600 showing a row logic circuit according to various embodiments. In various embodiments, the first transistor may be activated by a first word line voltage (e.g. WL_P<3>) applied to the control gate of the first transistor (not shown in FIG. 6). In various embodiments, the second transistor may be activated by a second word line voltage (e.g. WL_N<3>) applied to the control gate of the second transistor (not shown in FIG. 6). The first transistor may be activated when the first word line voltage (e.g. WL_P<3>) is low. The second transistor may be activated when the second word line voltage (e.g. WL_N<3>) is high.

The circuit arrangement may further include a first word line 602a coupled to the control electrode of the first transistor. The circuit arrangement may further include a second word line 602b coupled to the control electrode of the second transistor. The first transistor may be activated by the first word line voltage (e.g. WL_N<3>) applied to the control electrode of the first transistor via the first word line 602a. The second transistor may be activated by the second word line voltage (e.g. WL_P<3>) applied to the control electrode of the second transistor via the second word line 602b.

The circuit arrangement may further include a row logic circuit 604 coupled to the first transistor and coupled to the second transistor. The row logic circuit 604 may be configured to control the first word line voltage (e.g. WL_N<3>) and the second word line voltage (e.g. WL_P<3>). In various embodiments, the circuit arrangement may further include a row addressing circuit 606 coupled to the row logic circuit 604. The row addressing circuit 606 may be configured to provide or control the first word line voltage (e.g. WL_N<3>) and the second word line voltage (e.g. WL_P<3>).

The row logic circuit 604 may be configured to control the first word line voltage (e.g. WL_N<3>) and the second word line voltage (e.g. WL_P<3>) based on a data input signal (DATA_IN) or a read direction signal (RD_DIR). The row logic circuit 604 may be configured to switch between controlling the first word line voltage and the second word line voltage based on the data input signal (DATA_IN) or the read direction signal (RD_DIR) based on a write-read signal (WR) signal. The WR signal applied to the row logic circuit 604 may be the same as the WR signal applied to the column logic circuit. The data input signal (DATA_IN) applied to the row logic circuit 604 may be the same as the data input signal (IN) applied to the column logic circuit.

The row logic circuit 604 may include a first multiplexer 606a and a second multiplexer 606b. The first multiplexer 606a and the second multiplexer 606b may be 2-to1 multiplexers. The output terminal of the first multiplexer 606a may be coupled to a first input terminal of NAND gate 608a. The output terminal of the second multiplexer 606b may be coupled to the first input terminal of AND gate 608b. The second input terminals of both NAND gate 608a and AND gate 608b may be coupled to the row addressing circuit 604.

The output terminal of NAND gate 608a may be coupled to the first transistor (via word line 602a). The output terminal of AND gate 608b may be coupled to the second transistor (via word line 602b).

The first multiplexer 606a may be configured to output a voltage only based on the data input signal (DATA_IN) (and not on the read direction signal (RD_DIR)) when the WR signal applied to the first multiplexer 606a is high. Similarly, the second multiplexer 606b may be configured to output a voltage only based on the data input signal (DATA_IN) (and not on the read direction signal (RD_DIR)) when the WR signal applied to the second multiplexer 606b is high.

A NOT gate 610 is coupled to the first input terminal of the first multiplexer 606a. When the data input signal (DATA_IN) applied to an input terminal of the NOT gate 610 is low, the output terminal of the NOT gate may be high. When the WR signal applied to the first multiplexer 606a is high, the output terminal of the first multiplexer 606a may follow the output terminal of the NOT gate and may be high.

The row addressing circuit 604 may be configured to provide word selection signals WL<0>, WL<1>, WL<2> or WL<3> to the row logic circuit for selecting a row in the memory array. For instance, if row 0 in the memory array is to be selected, the row addressing circuit 614 may set WL<0> to high and WL<1>, WL<2> and WL<3> to low. If row 3 is to be selected instead, the row addressing circuit 614 may set WL<3> to high and WL<0>, WL<1> and WL<2> to low. In other words, the row addressing circuit 614 may be configured to provide or control the first word line voltage and the second word line voltage. The row addressing circuit 614 may be configured to provide the row selection signals WL<0>, WL<1>, WL<2> or WL<3> based on the row addressing signals ROW_ADDR <0> and ROW_ADDR <1> applied to the row addressing circuit 614.

When the output terminal of the first multiplexer 606a is high and the corresponding row selection signal WL<3> is high, the output terminal at the NAND gate 608a may be low. The first transistor coupled to the output terminal at the NAND gate 608a may be a PMOS transistor and may be activated when the output terminal at the NAND gate 608a is low. Correspondingly, when the data input signal (DATA_IN) applied to the first input terminal of the second multiplexer 606b is low, the output terminal at the second multiplexer 606b may be low. The first input terminal at the AND gate 608b may be low. The second input terminal at the AND gate 608b may be high as WL<3> is set to high. The output terminal of the AND gate 608b may be low. The second transistor coupled to the output terminal at the AND gate 608b may be a NMOS transistor and may be deactivated or remain not activated when the output at the AND gate 608b is low. On the other hand, if WR is high and the data input signal (DATA_IN) is high, the first word line voltage applied to the first transistor may be high and the second word line voltage applied to the second transistor may be high. The first transistor may be a PMOS transistor, which is deactivated or remains not activated. The second transistor may be a NMOS transistor, which remains activated.

The row logic circuit 604 may be configured to activate one transistor and may be configured not to activate or to deactivate the other transistor during writing (WR is high) and when the circuit arrangement is addressed by the row addressing circuit 614, i.e. when the first transistor is activated, the second transistor is not activated, vice versa. The row logic circuit 604 may be configured not to activate both the first transistor and the second transistor when the circuit arrangement is not addressed by the row addressing circuit 614 during writing.

During reading, the WR signal may be set to low. The first multiplexer 606a and the second multiplexer 606b may be configured to output a voltage only based on the read direction signal (RD_DIR) and not on the data input signal (DATA_IN). A NOT gate 612 may be coupled to the second input terminal of the second multiplexer 606b. When the read direction signal (RD_DIR) is set to high, the output terminal of the first multiplexer 606a may be high and the output terminal of the second multiplexer 606b may be low (since the output terminal of the NOT gate 612 is low). The output terminal of the NAND gate 608a may be low when the second input terminal of the NAND gate 608a is high. The first transistor may be a PMOS transistor, which is activated. The output terminal of the AND gate 608b may be low. The second transistor, which may be a NMOS transistor, may remain unactivated or be deactivated.

The row logic circuit 604 may be configured to activate one transistor and may be configured not to activate or to deactivate the other transistor during reading (WR is low) and when the circuit arrangement is addressed by the row addressing circuit 614, i.e. when the first transistor is activated, the second transistor is not activated. The row logic circuit 604 may be configured not to activate both the first transistor and the second transistor when the circuit arrangement is not addressed by the row addressing circuit 614 during reading.

In various embodiments, the read direction signal (RD_DIR) may be fixed, e.g. fixed at high. As such, the row logic circuit 604 may be configured to activate the first transistor and may be configured not to activate the second transistor. The circuit arrangement may be configured such that current may only flow in one direction through the data cell in the addressed circuit arrangement during reading while current may flow in the first direction or in the second direction (opposite to the first direction) through the data cell in the addressed circuit arrangement depending on the data input signal during writing.

Figure 12:
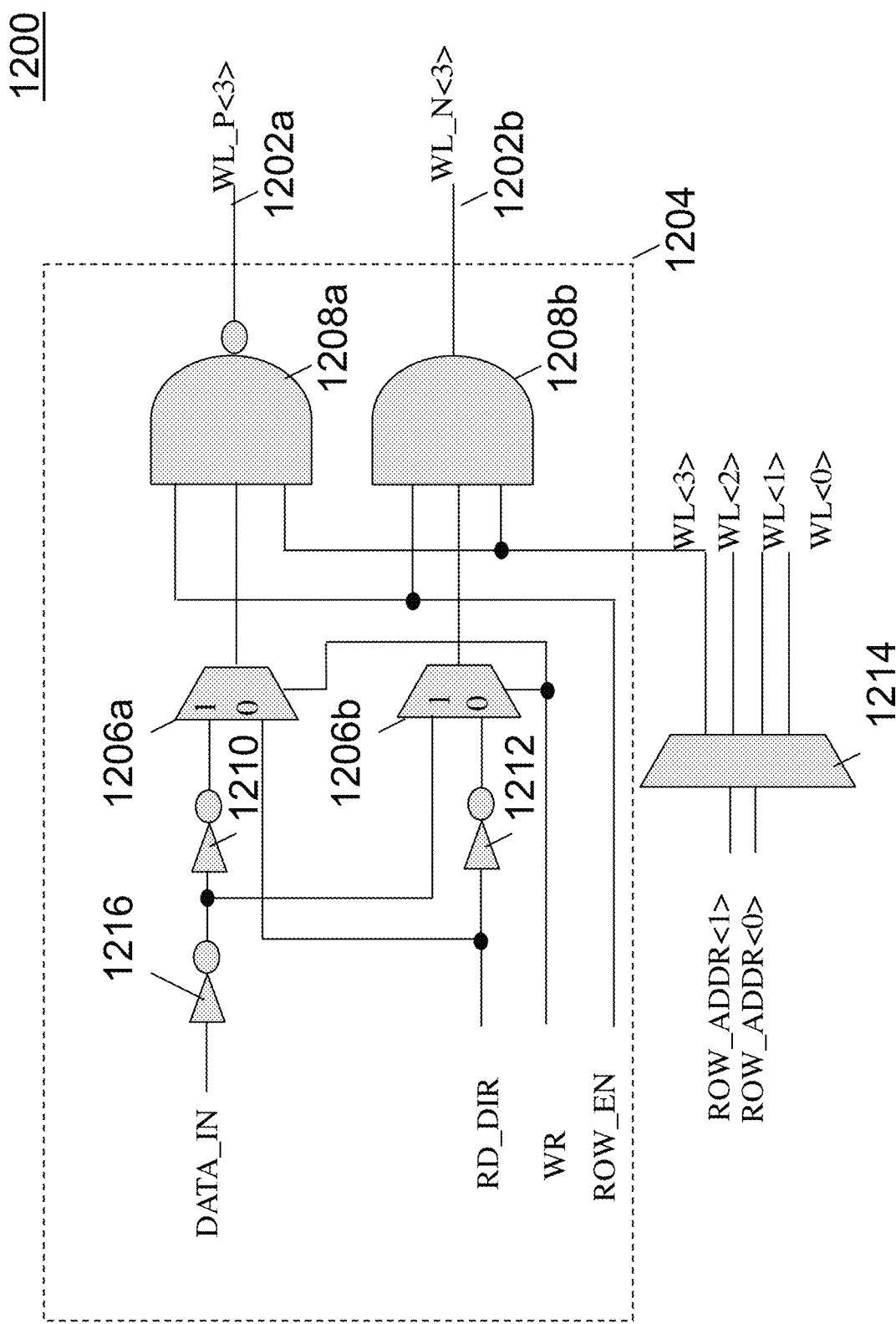
FIG. 12 is a schematic showing a row logic circuit according to various embodiments.

FIG. 12 is a schematic 1200 showing a row logic circuit according to various embodiments. The row logic circuit may be an alternative to the row logic circuit shown in FIG. 6. In various embodiments, the first transistor may be activated by a first word line voltage (e.g. WL_P<3>) applied to the control gate of the first transistor (not shown in FIG. 12). In various embodiments, the second transistor may be activated by a second word line voltage (e.g. WL_N<3>) applied to the control gate of the second transistor (not shown in FIG. 12). The first transistor may be activated when the first word line voltage (e.g. WL_P<3>) is low. The second transistor may be activated when the second word line voltage (e.g. WL_N<3>) is high.

The circuit arrangement may further include a first word line 1202a coupled to the control electrode of the first transistor. The circuit arrangement may further include a second word line 1202b coupled to the control electrode of the second transistor. The first transistor may be activated by the first word line voltage (e.g. WL_N<3>) applied to the control electrode of the first transistor via the first word line 1202a. The second transistor may be activated by the second word line voltage (e.g. WL_P<3>) applied to the control electrode of the second transistor via the second word line 1202b.

The circuit arrangement may further include a row logic circuit 1204 coupled to the first transistor and coupled to the second transistor. The row logic circuit 1204 may be configured to control the first word line voltage (e.g. WL_N<3>) and the second word line voltage (e.g. WL_P<3>). In various embodiments, the circuit arrangement may further include a row addressing circuit 1206 coupled to the row logic circuit 1204. The row addressing circuit 1206 may be configured to provide or control the first word line voltage (e.g. WL_N<3>) and the second word line voltage (e.g. WL_P<3>).

The row logic circuit 1204 may be configured to control the first word line voltage (e.g. WL_N<3>) and the second word line voltage (e.g. WL_P<3>) based on a data input signal (DATA_IN) or a read direction signal (RD_DIR). The row logic circuit 1204 may be configured to switch between controlling the first word line voltage and the second word line voltage using the data input signal (DATA_IN) or the read direction signal (RD_DIR) based on a write-read signal (WR) signal. The WR signal applied to the row logic circuit 1204 may be the same as the WR signal applied to the column logic circuit. The data input signal (DATA_IN) applied to the row logic circuit 1204 may be the same as the data input signal (IN) applied to the column logic circuit.

The row logic circuit 1204 may include a first multiplexer 1206a and a second multiplexer 1206b. The first multiplexer 1206a and the second multiplexer 1206b may be 2-tol multiplexers. The output terminal of the first multiplexer 1206a may be coupled to a first input terminal of NAND gate 1208a. The output terminal of the second multiplexer 1206b may be coupled to the first input terminal of AND gate 1208b. The second input terminals of both NAND gate 1208a and AND gate 1208b may be coupled to the row addressing circuit 1214. The third input terminals of the NAND gate 1208a and AND gate 1208b may be configured to receive a row enable signal (ROW_EN). The output terminal of NAND gate 1208a may be coupled to the first transistor (via word line 1202a). The output terminal of AND gate 1208b may be coupled to the second transistor (via word line 1202b).

The first multiplexer 1206a may be configured to output a voltage only based on the data input signal (DATA_IN) (and not on the read direction signal (RD_DIR)) when the WR signal applied to the first multiplexer 1206a is high. Similarly, the second multiplexer 1206b may be configured to output a voltage only based on the data input signal (DATA_IN) (and not on the read direction signal (RD_DIR)) when the WR signal applied to the second multiplexer 1206b is high.

A NOT gate 1210 is coupled to the first input terminal of the first multiplexer 1206a. A further NOT gate 1216 is coupled to the input terminal of the NOT gate 1210 and the first input terminal of the second multiplexer 1206b. When the data input signal (DATA_IN) applied to an input terminal of the further NOT gate 1216 is high, the output terminal of the further NOT gate 1216 may be low. The output terminal of the NOT gate 1210 may be high. When the WR signal applied to the first multiplexer 1206a is high, the output terminal of the first multiplexer 1206a may follow the output terminal of the NOT gate 1210 and may be high.

The row addressing circuit 1214 may be configured to provide word selection signals WL<0>, WL<1>, WL<2> or WL<3> to the row logic circuit 1204 for selecting a row in the memory array. For instance, if row 0 in the memory array is to be selected, the row addressing circuit 1214 may set WL<0> to high and WL<1>, WL<2> and WL<3> to low. If row 3 is to be selected instead, the row addressing circuit 1214 may set WL<3> to high and WL<0>, WL<1> and WL<2> to low. In other words, the row addressing circuit 1214 may be configured to provide or control the first word line voltage and the second word line voltage. The row addressing circuit 1214 may be configured to provide the row selection signals WL<0>, WL<1>, WL<2> or WL<3> based on the row addressing signals ROW_ADDR <0> and ROW_ADDR <1> applied to the row addressing circuit 1214.

When the row enable signal ROW_EN is high, the output terminal of the first multiplexer 1206a is high and the corresponding row selection signal WL<3> is high, the output terminal at the NAND gate 1208*a* may be low. The first transistor coupled to the output terminal at the NAND gate 1208*a* may be a PMOS transistor and may be activated when the output terminal at the NAND gate 1208*a* is low. Correspondingly, when the data input signal (DATA_IN) applied to the further NOT gate 1216 is high, the output terminal of the further NOT gate 1216 may be low. The first input terminal of the second multiplexer 1206*b* may be low and the output terminal at the second multiplexer 1206*b* may be low. The first input terminal at the AND gate 1208*b* may be low. The second input terminal at the AND gate 1208*b* may be high as WL<3> is set to high. The row enable signal ROW_EN may also be high. The output terminal of the AND gate 1208*b* may be low. The second transistor coupled to the output terminal at the AND gate 1208*b* may be a NMOS transistor and may be deactivated or remain not activated when the output at the AND gate 1208*b* is low. On the other hand, if WR is high (ROW_EN and WL<3> are also high) and the data input signal (DATA_IN) is low, the first word line voltage applied to the first transistor may be high and the second word line voltage applied to the second transistor may be high. The first transistor may be a PMOS transistor, which is deactivated or remains not activated. The second transistor may be a NMOS transistor, which remains activated.

The row logic circuit 1204 may be configured to activate one transistor and may be configured not to activate or to deactivate the other transistor during writing (WR is high) and when the circuit arrangement is addressed by the row addressing circuit 1214, i.e. when the first transistor is activated, the second transistor is not activated, vice versa. The row logic circuit 1204 may be configured not to activate both the first transistor and the second transistor when the circuit arrangement is not addressed by the row addressing circuit 1214 during writing. The row addressing circuit may be a 2-4 decoder.

During reading, the WR signal may be set to low. The first multiplexer 1206*a* and the second multiplexer 1206*b* may be configured to output a voltage only based on the read direction signal (RD_DIR) and not on the data input signal (DATA_IN). A NOT gate 1212 may be coupled to the second input terminal of the second multiplexer 1206*b*. When the read direction signal (RD_DIR) is set to high, the output terminal of the first multiplexer 1206*a* may be high and the output terminal of the second multiplexer 1206*b* may be low (since the output terminal of the NOT gate 1212 is low). The output terminal of the NAND gate 1208*a* may be low when the second input terminal of the NAND gate 1208*a* is high. The first transistor may be a PMOS transistor, which is activated. The output terminal of the AND gate 1208*b* may be low. The second transistor, which may be a NMOS transistor, may remain unactivated or be deactivated.

The row logic circuit 1204 may be configured to activate one transistor and may be configured not to activate or to deactivate the other transistor during reading (WR is low) and when the circuit arrangement is addressed by the row addressing circuit 1214, i.e. when the first transistor is activated, the second transistor is not activated. The row logic circuit 1204 may be configured not to activate both the first transistor and the second transistor when the circuit arrangement is not addressed by the row addressing circuit 1214 during reading.

In various embodiments, the read direction signal (RD_DIR) may be fixed, e.g. fixed at high. As such, the row logic circuit 1204 may be configured to activate the first transistor and may be configured not to activate the second transistor. The circuit arrangement may be configured such that current may only flow in one direction through the data cell in the addressed circuit arrangement during reading while current may flow in the first direction or in the second direction (opposite to the first direction) through the data cell in the addressed circuit arrangement depending on the data input signal during writing.

When the row enable signal ROW_EN is low, the output of the NAND gate 1208*a* may be high and the output terminal of the AND gate may low regardless of the signals provided by the row addressing circuit 1214 as well as input signals DATA_IN, WR and RD_DIR. In other words, the first transistor and the second transistor may remain unactivated regardless of the signals provided by the row addressing circuit 1214 as well as input signals DATA_IN, WR and RD_DIR. The row logic circuit 1204 may be configured to turn off the first transistors and the second transistors along a row through the row enable signal ROW_EN.

Figure 7:
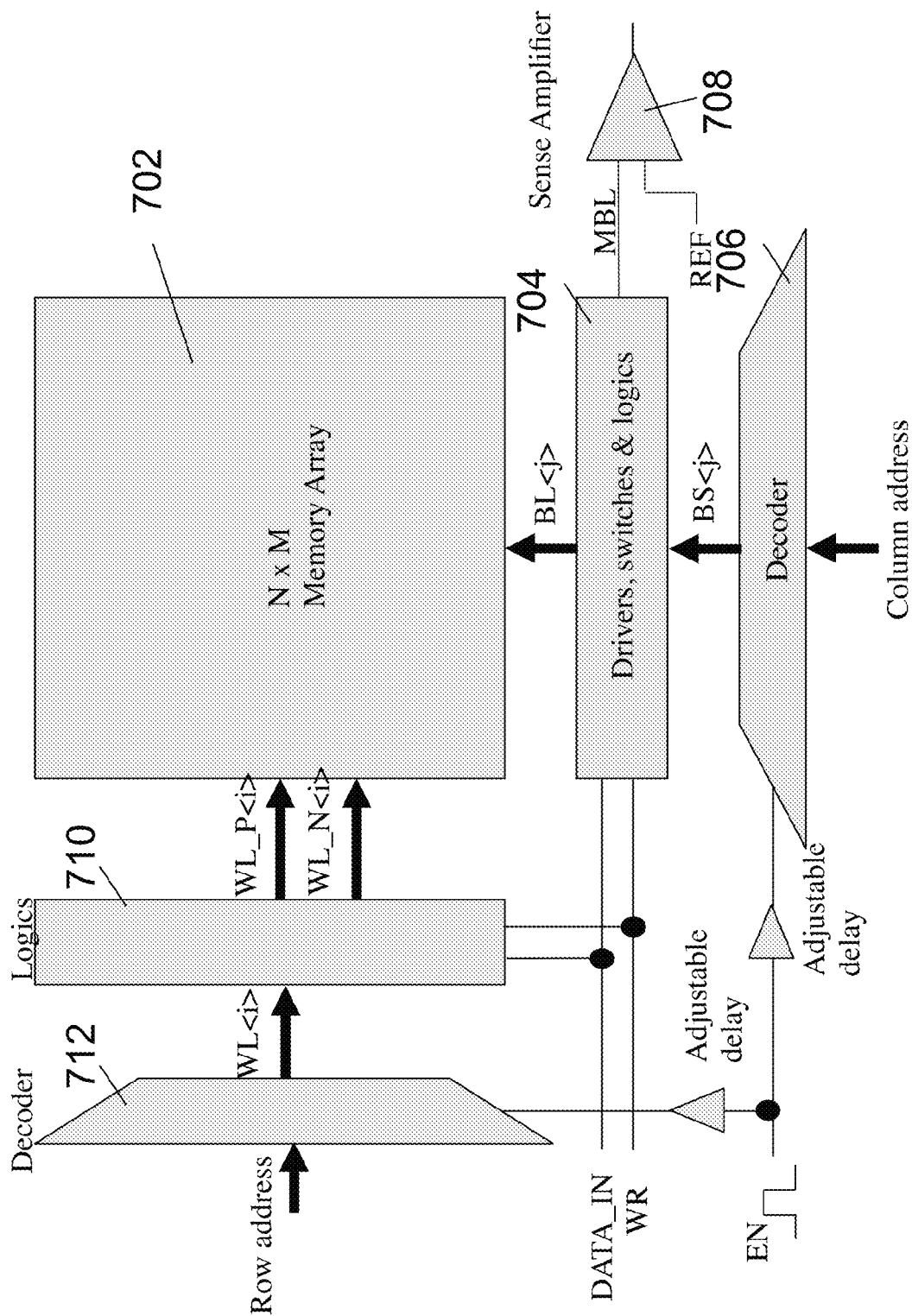
FIG. 7 is a schematic illustrating a memory array circuit arrangement according to various embodiments.

FIG. 7 is a schematic 700 illustrating a memory array circuit arrangement according to various embodiments. The memory array circuit arrangement may include a memory array 702. The memory array 702 may correspond to the memory array shown in FIG. 4. The memory array 702 may include a plurality of circuit arrangements (memory cells). The memory array circuit arrangement may further include a column logic circuit 704 coupled to the memory array 702. The memory array circuit arrangement may also include a column addressing circuit 706 coupled to the column logic circuit 704. The memory array circuit arrangement may additionally include a sensing circuit 708 coupled to the column logic circuit 704. The column logic circuit may include one or more driver circuits for providing writing voltages or writing currents to the memory array.

The column logic circuit 704 may be configured to switch between accessing a read voltage (or read current) from and providing a write voltage (or write current) to a circuit arrangement of the plurality of circuit arrangements in the memory array. The column logic circuit 704 may be configured to switch between accessing the read voltage (or read current) from and providing the write voltage (or write current) to the circuit arrangement addressed by the column addressing circuit 704. The column logic circuit 704 may be configured to switch between accessing the read voltage (or read current) from and providing the write voltage (or write current) based on a write-read WR signal applied to the column logic circuit.

The column logic circuit 704 may be configured to provide a writing voltage or writing current to the circuit arrangement addressed by the column addressing circuit 706 during writing (e.g. WR is high). The writing voltage or writing current provided by the column logic circuit 706 may be based on the data input signal DATA_IN. The column logic circuit 706 may be further configured not to provide the writing current or writing voltage (i.e. the writing current or writing voltage is substantially zero) when the circuit arrangement is not addressed by the column addressing circuit 706. The column logic circuit 704 may be configured to electrically isolate the sensing circuit 708 from the writing current or writing voltage during writing.

The column logic circuit 704 may be configured to electrically connect the sensing circuit 708 with the circuit arrangement addressed by the column addressing circuit 706 during reading (e.g. WR is low). The column logic circuit 704 may be configured to electrically isolate the sensing circuit 708 from the circuit arrangement not addressed by the column addressing circuit 706 during reading. The column logic circuit 704 may also be configured to disable to deactivate the one or more driver circuits during reading so that there is no writing voltage or writing current applied to the circuit arrangement.

The memory array circuit arrangement may further include a row logic circuit 710 coupled to the memory array 702. The memory array circuit arrangement and further include a row addressing circuit 712 coupled to the row logic circuit 710. A circuit arrangement in the memory array 702 may be addressed via both the row addressing circuit 712 and the column addressing circuit 706. A circuit arrangement in the memory array 702 may be addressed via the row addressing circuit 712 based on the row address provided to the row addressing circuit 712 and the column addressing circuit 706 based on the column address provided to the column addressing circuit 706.

Each circuit arrangement in the memory array 702 may include a first transistor and a second transistor. The WR signal may also be applied to the row logic circuit 710. The data input signal DATA_IN may also applied to the row logic circuit 710. The row logic circuit 710 may be configured to activate one transistor and may be configured not to activate or to deactivate the other transistor during writing (WR is high) and when the circuit arrangement is addressed by the row addressing circuit 712, i.e. when the first transistor is activated, the second transistor is not activated, vice versa. The row logic circuit 710 may be configured not to activate both the first transistor and the second transistor when the circuit arrangement is not addressed by the row addressing circuit 712 during writing.

The row logic circuit 710 may be configured to activate one transistor and may be configured not to activate or to deactivate the other transistor during reading (WR is low) and when the circuit arrangement is addressed by the row addressing circuit 712, i.e. when the first transistor is activated, the second transistor is not activated. The row logic circuit 710 may be configured not to activate both the first transistor and the second transistor when the circuit arrangement is not addressed by the row addressing circuit 712 during reading.

In various embodiments, the memory circuit arrangement may be configured such that current may only flow in one direction through the data cell in the addressed circuit arrangement during reading while current may flow in the first direction or in the second direction (opposite to the first direction) through the data cell in the addressed circuit arrangement depending on the data input signal DATA_IN during writing.

In various embodiments, each circuit arrangement may include a data cell. The memory array circuit arrangement may be configured such that a first current flow through the data cell in a circuit arrangement in a first direction when the first transistor is activated (i.e. when the circuit arrangement is addressed). The memory array circuit arrangement may be configured such that a second current flow through the data cell in a second direction, the second direction opposite the first direction, when the second transistor is activated (i.e. when the circuit arrangement is addressed). The flow of current may be determined by the data input signal DATA_IN provided to the column addressing circuit 706 and the row addressing circuit 712.

Figure 8A:
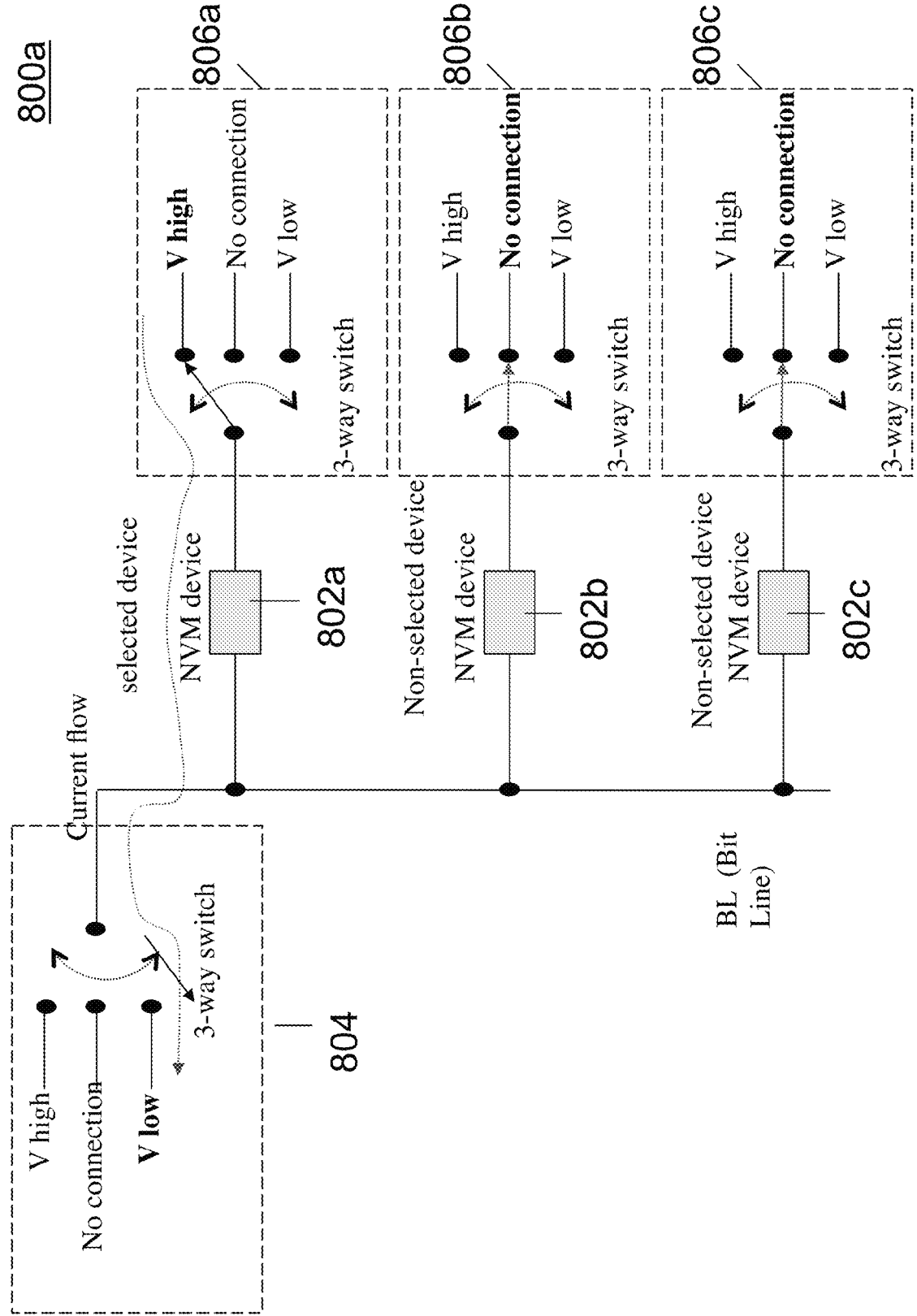
FIG. 8A shows a schematic of a memory array circuit arrangement according to various embodiments.

FIG. 8A shows a schematic 800a of a memory array circuit arrangement according to various embodiments. The memory array circuit arrangement may include a plurality of circuit arrangements. Each circuit arrangement may include a data cell. FIG. 8A shows three data cells 802a, 802b, 802c from three circuit arrangements. The second electrodes of the data cells 802a, 802b, 802c are coupled to a column logic circuit 804. The column logic circuit 804 may include a driver circuit. The memory array circuit arrangement may be configured such that the first electrode of each data cells 802a, 802b or 802c may be coupled to the first reference voltage (e.g. V high state) or to the second reference voltage (e.g. V lowstate) or neither to both the first reference voltage and to the second reference voltage (e.g. no connection state). The coupling of the first electrode to Vhigh, Vlow or no connection states may be determined by the row logic circuit. The coupling of the first electrode to Vhigh, Vlow or no connection states may be represented as a three-way switch as shown in FIG. 8A. Similarly, the second electrode of the data cell may be coupled via the driver circuit to the first reference voltage (e.g. Vhigh state) or to the second reference voltage (e.g. V lowstate) or neither to both the first reference voltage and to the second reference voltage (e.g. no connection state). As such, the coupling of the first electrode to Vhigh, Vlow or no connection states may also be represented as a three-way switch. FIG. 8A shows the flow of current from switch 806a to switch 804 when the first electrode of the data cell 802a is at the Vhigh state and the second electrode of the data cell 802a is at the Vlow state. Conversely, current may flow from switch 804 to switch 806a when the second electrode of the data cell 802a is at the Vhigh state and the first electrode of the data cell 802a is at the Vlow state. When the first electrode of a data cell (e.g. 802b, 802c) is in the no connection state, no current or an insubstantial current flows through the data cell. Similarly, when the second electrode of the data cell is in the no connection state, no current or an insubstantial current flows through the data cell.

Figure 8B:
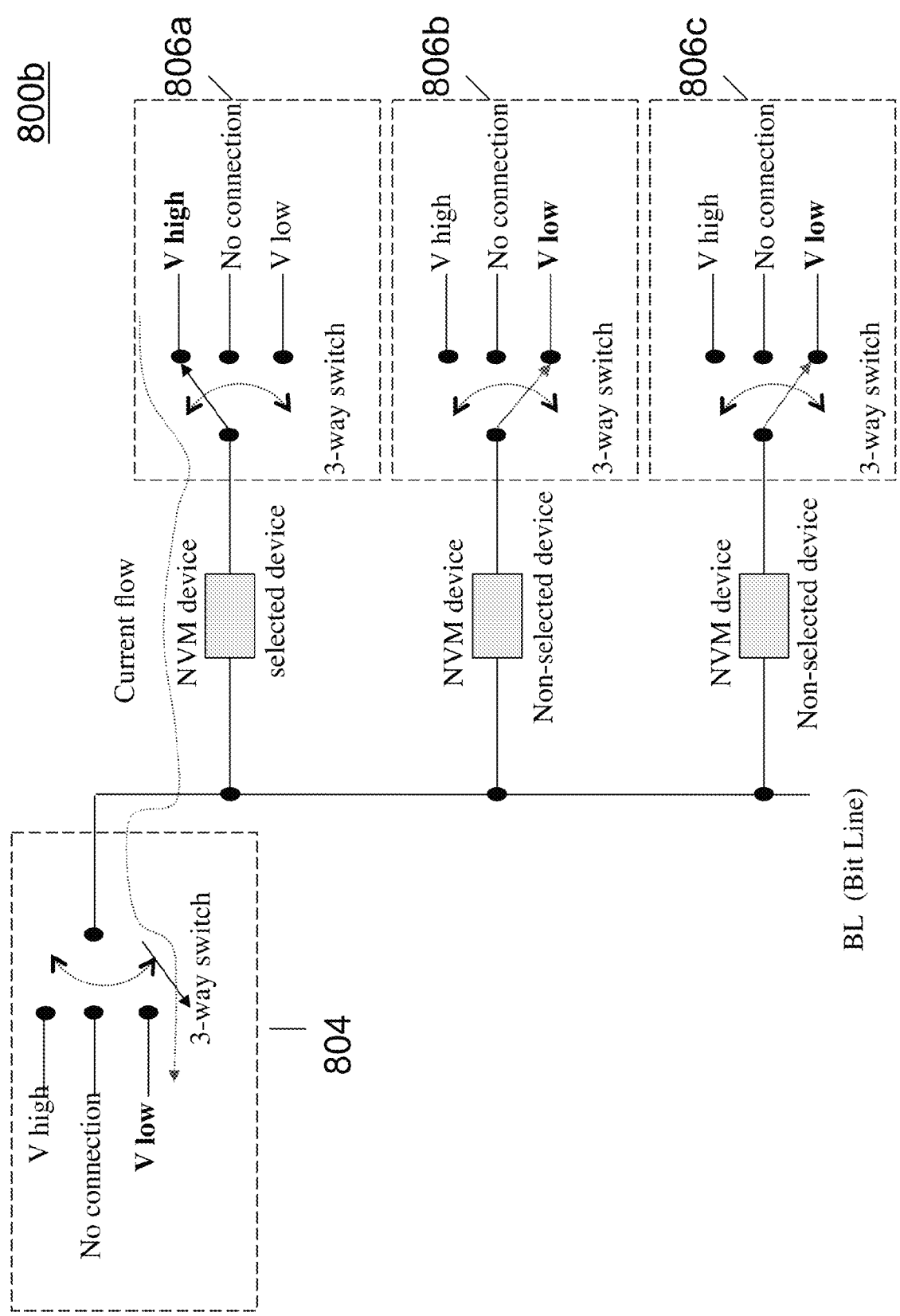
FIG. 8B shows a schematic of the memory array circuit arrangement in FIG. 8A according to various embodiments.

FIG. 8B shows a schematic 800b of the memory array circuit arrangement in FIG. 8A according to various embodiments. FIG. 8B shows that no current or an insubstantial current flows through a data cell (e.g. 802b, 802c) when the first electrode of the data cell is in the Vlow state and the second electrode of the data cell is in the Vlow state. Similarly, no current or an insubstantial current flows through a data cell (e.g. 802b, 802c) when the first electrode of the data cell is in the Vhigh state and the second electrode of the data cell is in the Vhigh state.

Figure 9:
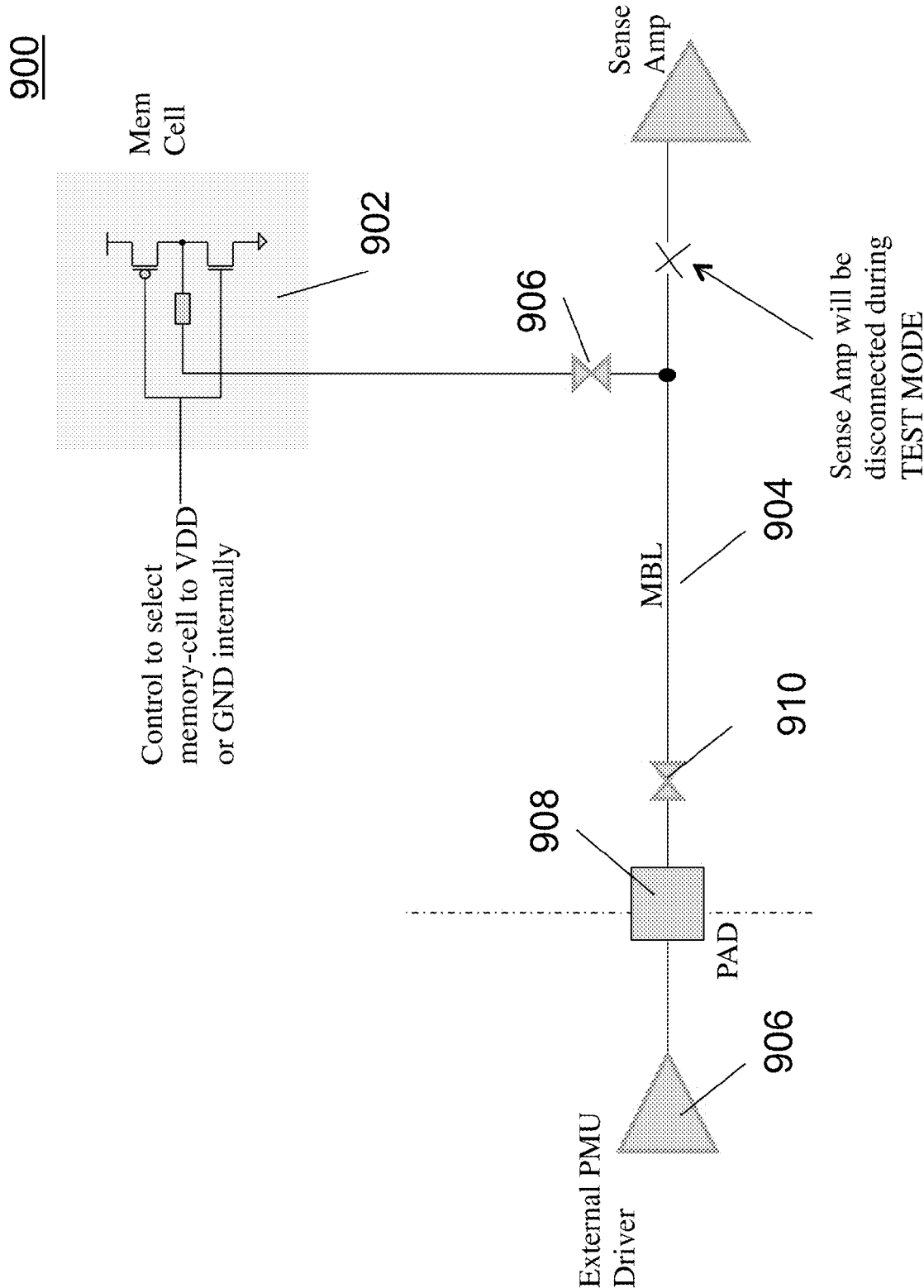
FIG. 9 shows a schematic of a circuit arrangement in test mode according to various embodiments.

FIG. 9 shows a schematic 900 of a circuit arrangement 902 in test mode according to various embodiments. The circuit arrangement 902 is coupled to the main bit line 904 by connecting the column select switch 906. The second electrode of the data cell is coupled to the main bit line 904 via the column select switch 906. An external parametric measurement unit (PMU) 906 may be coupled to a pad 908. The pad may be coupled to the main bit line 904 via a switch 910. The switch is configured to select the main bit lines of different subarrays. The sense amplifier 912 may be disconnected to the main bit line 904 during test mode. Only one circuit arrangement 902 is electrically connected to the PMU 906 during test mode.

FIG. 10 is a schematic illustrating a method of forming a circuit arrangement according to various embodiments. The method may include, in 1002, coupling a first controlled electrode of a first transistor and a first controlled electrode of a second transistor to a first electrode of a data cell. The method may further include, in 1004, electrically connecting a first reference voltage to a second controlled electrode of the first transistor such that the first electrode of the data cell is electrically connected to the first reference voltage via the first transistor when the first transistor is activated by a first word line voltage applied to the control electrode of the first transistor. The method may also include, in 1006, electrically connecting a second reference voltage to a second controlled electrode of the second transistor such that the first electrode of the data cell is electrically connected to the second reference voltage via the second transistor when the first transistor is activated by a second word line voltage applied to the control electrode of the second transistor.

In various embodiments, references to reference voltages may generally include references to reference currents.

In various embodiments, the circuit arrangement may be configured such that data cell is substantially free from current when the first transistor is deactivated and the second transistor is deactivated. In various embodiments, the circuit arrangement may be configured such that the data cell is substantially free from current when the second transistor is activated and a bit line voltage at the second electrode of the data cell is substantially equal to the second reference voltage. In various embodiments, the circuit arrangement may be configured such that the data cell is substantially free from current when the first transistor is activated and a bit line voltage at the second electrode of the data cell is substantially equal to the first reference voltage.

In various embodiments, the method may further include coupling a column logic circuit to the second electrode of the data cell. The column row logic circuit may be configured to switch between accessing a read voltage from and providing a write voltage to the second electrode of the data cell.

In various embodiments, the column logic circuit may include a write driver. The write voltage may be provided by the write driver. The write driver may be a voltage mode write driver.

The column row logic circuit may be configured to switch between accessing a read current from and providing a write current to the second electrode of the data cell.

In various embodiments, the column logic circuit may include a write driver. The write current may be provided by the write driver. The write driver may be a current mode write driver.

The method may further include coupling a sensing circuit to the column logic circuit. The read voltage may be accessed by the sensing circuit.

The method may also include coupling a column addressing circuit to the column logic circuit. The column addressing circuit may be configured to control whether to provide the write voltage and to access the read voltage.

The method may further include coupling a first word line to the control electrode of the first transistor. The method may also include coupling a second word line to the control electrode of the second transistor. The first transistor may be activated by the first word line voltage applied to the control electrode of the first transistor via the first word line. The second transistor may be activated by the second word line voltage applied to the control electrode of the second transistor via the second word line.

The method may further include coupling a row logic circuit to the first transistor and to the second transistor. The row logic circuit may be configured to control the first word line voltage and the second word line voltage.

The method may also include coupling a row addressing circuit to the row logic circuit. The row addressing circuit may be configured to provide the first word line voltage and the second word line voltage.

The first transistor may be a p-channel metal oxide semiconductor (PMOS) field effect transistor. The second transistor may be a n-channel metal oxide semiconductor (NMOS) field effect transistor.

In various embodiments, the data cell may be configured to have a first resistance upon flow of the first current though the data cell in the first direction. The data cell may be configured to have a second resistance, the second resistance different from the first resistance, upon flow of the second current though the data cell in the second direction. The data cell may include a magnetic tunneling junction.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

The invention claimed is:

1. A circuit arrangement comprising:
a data cell having a first electrode and a second electrode;
a first transistor having a control electrode, a first controlled electrode and a second controlled electrode;
a second transistor having a control electrode, a first controlled electrode and a second controlled electrode;
wherein the first controlled electrode of the first transistor and the first controlled electrode of the second transistor are coupled to the first electrode of the data cell;
wherein the second controlled electrode of the first transistor is configured to electrically connect to a first reference voltage such that the first electrode of the data cell is electrically connected to the first reference voltage via the first transistor when the first transistor is activated by a first word line voltage applied to the control electrode of the first transistor;
wherein the second controlled electrode of the second transistor is configured to electrically connect to a second reference voltage, such that the first electrode of the data cell is electrically connected to the second reference voltage via the second transistor when the second transistor is activated by a second word line voltage applied to the control electrode of the second transistor;
wherein the first reference voltage is higher than the second reference voltage;
wherein the circuit arrangement is configured such that a first current flows through the data cell in a first direction when the first transistor is activated; and
wherein the circuit arrangement is configured such that a second current flows through the data cell in a second direction, the second direction opposite the first direction, when the second transistor is activated.

2. The circuit arrangement according to claim 1, wherein the circuit arrangement is configured such that data cell is substantially free from current when the first transistor is deactivated and the second transistor is deactivated.

3. The circuit arrangement according to claim 1, wherein the circuit arrangement is configured such that the data cell is substantially free from current when the second transistor is activated and a bit line voltage at the second electrode of the data cell is substantially equal to the second reference voltage.

4. The circuit arrangement according to claim 1, the circuit arrangement further comprising:
a column logic circuit coupled to the second electrode of the data cell.

5. The circuit arrangement according to claim 4, wherein the column logic circuit is configured to switch between accessing a read voltage from and providing a write voltage to the second electrode of the data cell.

6. The circuit arrangement according to claim 5,
wherein the column logic circuit comprises a write driver;
wherein the write voltage is provided by the write driver; and
wherein the write driver is a voltage mode write driver.

7. The circuit arrangement according to claim 4, wherein the column row logic circuit is configured to switch between accessing a read current from and providing a write current to the second electrode of the data cell.

8. The circuit arrangement according to claim 7,
wherein the column logic circuit comprises a write driver;
wherein the write current is provided by the write driver; and
wherein the write driver is a current mode write driver.

9. The circuit arrangement according to claim 5, the circuit arrangement further comprising:
a sensing circuit coupled to the column logic circuit; and
wherein the read voltage is accessed by the sensing circuit.

10. The circuit arrangement according to claim 5, the circuit arrangement further comprising:
a column addressing circuit coupled to the column logic circuit;
wherein the column addressing circuit is configured to control whether to provide the write voltage and to access the read voltage.

11. The circuit arrangement according to claim 1, the circuit arrangement further comprising:
a first word line coupled to the control electrode of the first transistor; and
a second word line coupled to the control electrode of the second transistor;
wherein the first transistor is activated by the first word line voltage applied to the control electrode of the first transistor via the first word line; and
wherein the second transistor is activated by the second word line voltage applied to the control electrode of the second transistor via the second word line.

12. The circuit arrangement according to claim 1, the circuit arrangement further comprising:
a row logic circuit coupled to the first transistor and coupled to the second transistor.

13. The circuit arrangement according to claim 12, wherein the row logic circuit is configured to control the first word line voltage and the second word line voltage.

14. The circuit arrangement according to claim 13, the circuit arrangement further comprising:
a row addressing circuit coupled to the row logic circuit;
wherein the row addressing circuit is configured to provide the first word line voltage and the second word line voltage.

15. The circuit arrangement according to claim 1, wherein the first transistor is a p-channel metal oxide semiconductor (PMOS) field effect transistor.

16. The circuit arrangement according to claim 1, wherein the second transistor is a n-channel metal oxide semiconductor (NMOS) field effect transistor.

17. The circuit arrangement according to claim 1,
wherein the data cell is configured to have a first resistance upon flow of the first current though the data cell in the first direction; and
wherein the data cell is configured to have a second resistance, the second resistance different from the first resistance, upon flow of the second current though the data cell in the second direction.

18. The circuit arrangement according to claim 1, wherein the data cell comprises a magnetic tunneling junction.

19. A method of forming a circuit arrangement, the method comprising:
coupling a first controlled electrode of a first transistor and a first controlled electrode of a second transistor to a first electrode of a data cell;
electrically connecting a first reference voltage to a second controlled electrode of the first transistor such that the first electrode of the data cell is electrically connected to the first reference voltage via the first transistor when the first transistor is activated by a first word line voltage applied to the control electrode of the first transistor;
electrically connecting a second reference voltage to a second controlled electrode of the second transistor such that the first electrode of the data cell is electrically connected to the second reference voltage via the second transistor when the first transistor is activated by a second word line voltage applied to the control electrode of the second transistor;
wherein the first reference voltage is higher than the second reference voltage;
wherein the circuit arrangement is configured such that a first current flows through the data cell in a first direction when the first transistor is activated; and
wherein the circuit arrangement is configured such that a second current flows through the data cell in a second direction, the second direction opposite the first direction, when the second transistor is activated.

* * * * *